(12) United States Patent
Imaoka et al.

(10) Patent No.: US 6,628,174 B2
(45) Date of Patent: Sep. 30, 2003

(54) VOLTAGE-CONTROLLED OSCILLATOR AND COMMUNICATION DEVICE

(75) Inventors: Toshikazu Imaoka, Ogaki (JP); Katsuaki Onoda, Ohta (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/985,940

(22) Filed: Nov. 6, 2001

(65) Prior Publication Data

US 2002/0093388 A1 Jul. 18, 2002

(30) Foreign Application Priority Data

Nov. 6, 2000 (JP) .......................................... 2000-337182
Oct. 23, 2001 (JP) .......................................... 2001-325074

(51) Int. Cl.$^7$ ............................................. H03B 11/10
(52) U.S. Cl. ............................... 331/107 SL; 331/36 C; 331/117 FE
(58) Field of Search ................... 331/107 SL, 117 D, 331/96, 177 V, 177 FE, 36 C

(56) References Cited

U.S. PATENT DOCUMENTS 5,708,397 A * 1/1998 Furutani et al. ....... 331/107 SL

FOREIGN PATENT DOCUMENTS

JP 3-276908 12/1991
JP 8-335828 12/1996

* cited by examiner

*Primary Examiner*—Robert Pascal
*Assistant Examiner*—Kimberly E Glenn
(74) *Attorney, Agent, or Firm*—Armstrong, Westerman & Hattori, LLP

(57) ABSTRACT

An impedance transformer is so designed that the impedance and the reactance of a tuning part reach zero at a central control voltage. An open stub is employed for setting the characteristic impedance of a tuning stub to the minimum value when a variable reactance circuit is inductive while setting the characteristic impedance to −1.22 times the reactance of the variable reactance circuit when the variable reactance circuit is capacitive. A short stub is employed for setting the characteristic impedance of the tuning stub to 0.82 times the reactance of the variable reactance circuit when the variable reactance is inductive, while setting the characteristic impedance to the maximum when the variable reactance circuit is capacitive.

14 Claims, 14 Drawing Sheets

FIG. 10

| | LIMITATION OF $Z_{st}$ | TUNING STUB | $A=\omega \cdot L$ | | $B=50\Omega$ | $\alpha=A/B$ | | $Z_{st}$ ($\Omega$) | $\Theta_{st}$ rad(deg) |
|---|---|---|---|---|---|---|---|---|---|
| | | | $A=40\Omega$ L=0.634nH | $A=60\Omega$ L=0.955nH | $B=1/\omega \cdot C$ C=0.318pF | $\alpha>1$: INDUCTIVE | $\alpha<1$: CAPACITIVE | | |
| (a) | 20~60 $\Omega$ | OPEN FORWARD END | | ● | ● | 1.2 | | 20 | 1.107(63.4) |
| (b) | | SHORTED FORWARD END | ● | | ● | | 0.8 | 20 | 2.034(116.6) |
| (c) | | | ● | | ● | | 0.8 | 60 | 0.165(29.7) |
| (d) | UNLIMITED | OPEN FORWARD END | | ● | ● | 1.2 | | 20 | 2.678(153.4) |
| (e) | | SHORTED FORWARD END | ● | | ● | | 0.8 | 12.2 | $23\pi/32$ (129.4) |
| (f) | | | | ● | ● | 1.2 | | 8.2 | |

F I G. 1 5
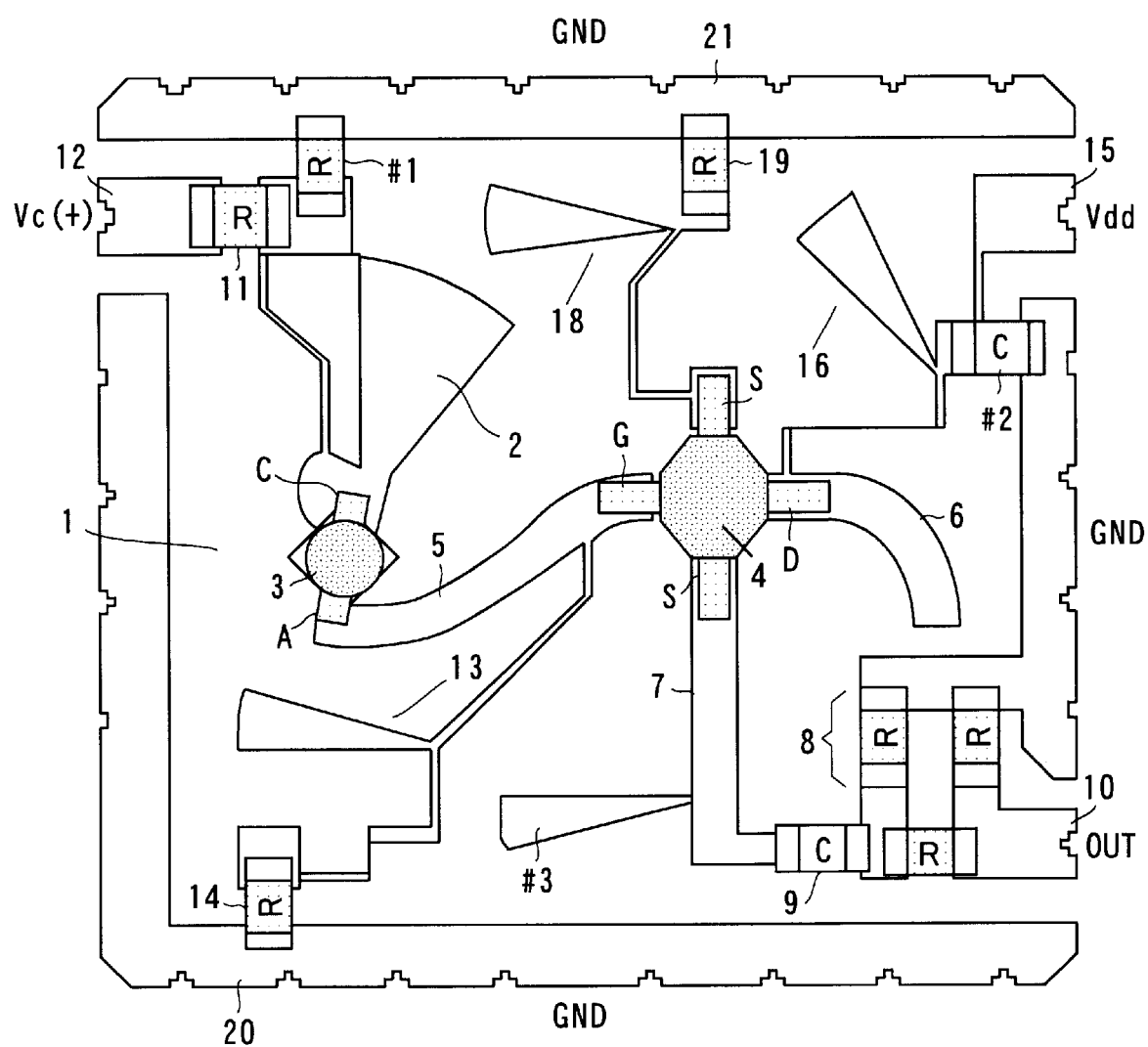

VOLTAGE-CONTROLLED OSCILLATOR AND COMMUNICATION DEVICE

BACKGROUND OF THE INVENTION

1. Field of the Invention

The present invention relates to a voltage-controlled oscillator capable of changing an oscillation frequency by voltage control and a communication device employing the same.

2. Description of the Background Art

In general, a voltage-controlled oscillator employing a variable capacitance element such as a varactor diode is proposed. In the conventional voltage-controlled oscillator, the capacity-control voltage characteristic of the varactor diode employed as a tuning element is improved for attaining a broadband tuning range (width of change of the oscillation frequency with respect to change of a control voltage), optimizing the tuning range or improving linearity of change of the oscillation frequency with respect to change of the control voltage.

However, such improvement of the capacity-control voltage characteristic of the varactor diode is too limited to sufficiently broaden the band of the tuning range, sufficiently optimize the tuning range or sufficiently improve the linearity of change of the oscillation frequency with respect to change of the control voltage.

SUMMARY OF THE INVENTION

An object of the present invention is to provide a voltage-controlled oscillator capable of attaining a broadband tuning range and optimizing the tuning range while improving linearity of change of an oscillation frequency with respect to change of a control voltage and a communication device employing the same.

A voltage-controlled oscillator according to an aspect of the present invention comprises an oscillation part performing oscillation and a tuning part resonating within the oscillation frequency band of the oscillation part, while the tuning part includes an impedance transformer including a transmission line and a variable reactance circuit, connected between an end of the transmission line and the oscillation part, including a variable capacitance element having a capacitance value varying with a control voltage and an inductive component, a locus drawn by the impedance of the tuning part as viewed from the node between the oscillation part and the tuning part in response to change of the control voltage includes a point where reactance reaches substantially zero, and the characteristic impedance of the transmission line is so set that the rate of change of the capacitance value of the variable capacitance element with respect to change of the oscillation frequency is minimized within a prescribed range of the characteristic impedance of the transmission line.

In the voltage-controlled oscillator according to the present invention, the tuning part resonates in the oscillation frequency band of the oscillation part. When the control voltage is changed, the impedance of the tuning part as viewed from the node between the oscillation part and the tuning part draws a locus including a point where the reactance reaches substantially zero. In this case, the rate of change of the oscillation frequency with respect to change of the control voltage can be increased. The characteristic impedance of the transmission line is so set that the rate of change of the capacitance value of the variable capacitance element with respect to change of the oscillation frequency is minimized within a prescribed range of the characteristic impedance of the transmission line, whereby the rate of change of the oscillation frequency with respect to change of the capacitance value of the variable capacitance element is increased. Therefore, the rate of change of the oscillation frequency with respect to change of the control voltage is so increased that a broadband tuning range can be attained.

A desired range can be selected from the broadband tuning range, whereby the tuning range can be optimized.

Further, a range having excellent linearity of the capacity-control voltage characteristic of the variable capacitance element can be selectively used due to the broadband tuning range. Thus, linearity of change of the oscillation frequency with respect to change of the control voltage for the voltage-controlled oscillator is improved.

A necessary tuning range can be ensured by small change of the capacitance value of the variable capacitance element, whereby capacity change in the tuning range is reduced and change of a series resistance component of the variable capacitance element is also reduced. Therefore, fluctuation of a phase noise characteristic caused by change of the oscillation frequency is reduced.

The Q-value of the tuning part as well as the phase noise characteristic are improved by performing tuning in a region of the control voltage having a small dc resistance component of the variable capacitance element.

The impedance of the tuning part as viewed from the node between the oscillation part and the tuning part at the central value of the control voltage may be so set that the reactance substantially reaches zero. Thus, the rate of change of the oscillation frequency with respect to change of the control voltage can be increased.

The other end of the transmission line may be opened, the reactance of the variable reactance circuit may be inductive at the central value of the control voltage, and the characteristic impedance of the transmission line may be set to the minimum value within the prescribed range.

When the other end of the transmission line is opened and the reactance of the variable reactance circuit is inductive at the central value of the control voltage, the rate of change of the capacitance value of the variable capacitance element with respect to change of the oscillation frequency is reduced as the characteristic impedance of the transmission line is reduced. Therefore, the rate of change of the oscillation frequency with respect to change of the capacitance value of the variable capacitance element can be increased by setting the characteristic impedance of the transmission line to the minimum value within the prescribed range. Consequently, the rate of change of the oscillation frequency with respect to change of the control voltage can be increased, for attaining a broadband tuning range.

The characteristic impedance of the transmission line may be set lower than 50Ω. When the other end of the transmission line is opened and the reactance of the variable reactance circuit is capacitive at the central value of the control voltage, the rate of change of the capacitance value of the variable capacitance element with respect to change of the oscillation frequency is reduced as the characteristic impedance of the transmission line is reduced. Therefore, the rate of change of the oscillation frequency with respect to change of the control voltage can be increased for attaining a broadband tuning range by setting the characteristic impedance of the transmission line lower than 50Ω.

The other end of the transmission line may be opened, the reactance of the variable reactance circuit may be inductive at the central value of the control voltage, and the characteristic impedance of the transmission line may be so set as to minimize the rate of change of the capacitance value of the variable capacitance element with respect to change of the oscillation frequency.

When the other end of the transmission line is opened and the reactance of the variable reactance circuit is capacitive at the central value of the control voltage, the rate of change of the capacitance value of the variable capacitance element with respect to change of the oscillation frequency has the minimum value. Therefore, the rate of change of the oscillation frequency with respect to change of the capacitance value of the variable capacitance element can be increased by setting the characteristic impedance of the transmission line to minimize the rate of change of the capacitance value of the variable capacitance element with respect to change of the oscillation frequency. Consequently, the rate of change of the oscillation frequency with respect to change of the control voltage can be increased for attaining a broadband tuning range.

The characteristic impedance of the transmission line may be set substantially to $\tan(23\pi/32)$ times the reactance of the variable reactance circuit at the central value of the control voltage, while the electric length of the transmission line may be set substantially to $(23\pi/32)$ [rad].

When the other end of the transmission line is opened and the reactance of the variable reactance circuit is capacitive at the central value of the control voltage, the rate of change of the capacitance value of the variable capacitance element with respect to change of the oscillation frequency has the minimum value substantially at the electric length $(23\pi/32)$ of the transmission line. Therefore, the rate of change of the oscillation frequency with respect to change of the capacitance value of the variable capacitance element can be increased by setting the characteristic impedance of the transmission line substantially to $\tan(23\pi/32)$ times the reactance of the variable reactance circuit at the central value of the control voltage while setting the electric length of the transmission line substantially to $(23\pi/32)$ [rad]. Consequently, the rate of change of the oscillation frequency with respect to change of the control voltage can be increased for attaining a broadband tuning range.

The other end of the transmission line may be shorted, the reactance of the variable reactance circuit may be inductive at the central value of the control voltage, and the characteristic impedance of the transmission line may be so set as to minimize the rate of change of the capacitance value of the variable capacitance element with respect to change of the oscillation frequency.

When the other end of the transmission line is shorted and the reactance of the variable reactance circuit is inductive at the central value of the control voltage, the rate of change of the capacitance value of the variable capacitance element with respect to change of the oscillation frequency has the minimum value. Therefore, the rate of change of the oscillation frequency with respect to change of the capacitance value of the variable capacitance element can be increased by setting the characteristic impedance of the transmission line to minimize the rate of change of the capacitance value of the variable capacitance element with respect to change of the oscillation frequency. Consequently, the rate of change of the oscillation frequency with respect to change of the control voltage can be increased for attaining a broadband tuning range.

The characteristic impedance of the transmission line may be set substantially to $\cot(23\pi/32)$ times the reactance of the variable reactance circuit at the central value of the control voltage, and the electric length of the transmission line may be set substantially to $(23\pi/32)$ [rad].

When the other end of the transmission line is shorted and the reactance of the variable reactance circuit is inductive at the central value of the control voltage, the rate of change of the capacitance value of the variable capacitance element with respect to change of the oscillation frequency has the minimum value substantially at the electric length $(23\pi/32)$ [rad] of the transmission line. Therefore, the rate of change of the oscillation frequency with respect to change of the capacitance value of the variable capacitance element can be increased by setting the characteristic impedance of the transmission line substantially to $\cot(23\pi/32)$ times the reactance of the variable reactance circuit at the central value of the control voltage while setting the electric length of the transmission line substantially to $(23\pi/32)$ [rad]. Consequently, the rate of change of the oscillation frequency with respect to change of the control voltage can be increased for attaining a broadband tuning range.

The other end of the transmission line may be shorted, the reactance of the variable reactance circuit may be capacitive at the central value of the control voltage, and the characteristic impedance of the transmission line may be set to the maximum value within the prescribed range.

When the other end of the transmission line is shortened and the reactance of the variable reactance circuit is capacitive at the central value of the control voltage, the rate of change of the capacitance value of the variable capacitance element with respect to change of the oscillation frequency is reduced as the characteristic impedance of the transmission line is increased. Therefore, the rate of change of the oscillation frequency with respect to change of the capacitance value of the variable capacitance element can be increased by setting the characteristic impedance of the transmission line to the maximum value within the prescribed range. Consequently, the rate of change of the oscillation frequency with respect to change of the control voltage can be increased for attaining a broadband tuning range.

The characteristic impedance of the transmission line may be set higher than 50Ω. When the other end of the transmission line is shorted and the reactance of the variable reactance circuit is capacitive at the central value of the control voltage, the rate of change of the capacitance value of the variable capacitance element with respect to change of the oscillation frequency is reduced as the characteristic impedance of the transmission line is increased. Therefore, the rate of change of the oscillation frequency with respect to change of the control voltage can be increased for attaining a broadband tuning range by setting the characteristic impedance of the transmission line higher than 50Ω.

The other end of the transmission line may be opened, the inductive component and a capacitive component of the variable reactance circuit may be equally set at the central value of the control voltage, and the electric length of the transmission line may be set substantially to $(\pi/2)$ [rad].

When the other end of the transmission line is opened and the inductive component and the capacitive component of the variable reactance circuit are equally set at the central value of the control voltage, the variable reactance circuit enters a series resonance state. Thus, the rate of change of the capacitance value of the variable capacitance element with respect to change of the oscillation frequency is minimized when the electric length of the transmission line is substantially $(\pi/2)$ [rad] regardless of the characteristic impedance of the transmission line. Consequently, the rate of change of the oscillation frequency with respect to change of the control voltage can be increased for attaining a broadband tuning range.

The other end of the transmission line may be shorted, the inductive component and a capacitive component of the variable reactance circuit may be equally set at the central value of the control voltage, and the electric length of the transmission line may be set substantially to 0 [rad].

When the other end of the transmission line is shortened and the inductive component and the capacitive component of the variable reactance circuit are equally set at the central value of the control voltage, the variable reactance circuit enters a series resonance state. Thus, the rate of change of the capacitance value of the variable capacitance element with respect to change of the oscillation frequency is minimized when the electric length of the transmission line is substantially 0 [rad] regardless of the characteristic impedance of the transmission line. Consequently, the rate of change of the oscillation frequency with respect to change of the control voltage can be increased for attaining a broadband tuning range.

A fixed capacitor may be added to the variable capacitance element in a serial or parallel manner. Thus, the reactance of the variable reactance circuit can be arbitrarily adjusted.

A communication device according to another aspect of the present invention comprises a local oscillator including a voltage-controlled oscillator generating a reference signal and a frequency converter mixing the reference signal generated by the local oscillator with a transmitted signal or a received signal thereby converting the frequency of the transmitted signal or the received signal to a prescribed frequency, while the voltage-controlled oscillator comprises an oscillation part performing oscillation and a tuning part resonating within the oscillation frequency band of the oscillation part, the tuning part includes an impedance transformer including a transmission line and a variable reactance circuit, connected between an end of the transmission line and the oscillation part, including a variable capacitance element having a capacitance value varying with a control voltage and an inductive component, a locus drawn by the impedance of the tuning part as viewed from the node between the oscillation part and the tuning part in response to change of the control voltage includes a point where reactance reaches substantially zero, and the characteristic impedance of the transmission line is so set that the rate of change of the capacitance value of the variable capacitance element with respect to change of the oscillation frequency is minimized within a prescribed range of the characteristic impedance of the transmission line.

In the communication device according to the present invention, the local oscillator generates the reference signal and the frequency converter mixes the reference signal with the transmitted signal or the received signal, thereby changing the frequency of the transmitted signal or the received signal to the prescribed frequency.

This communication device employs the aforementioned voltage-controlled oscillator as the local oscillator, whereby a broadband tuning range can be attained.

The oscillation frequency of the local oscillator linearly changes with respect to the control voltage, while fluctuation of a phase noise characteristic caused by change of the oscillation frequency is reduced. Further, the phase noise characteristic of the local oscillator is improved.

Consequently, fluctuation of communication quality caused by switching of a frequency band or a channel allocated to a communication system is reduced while deterioration of the communication quality resulting from phase noise is reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 10 illustrates results of calculation of optimum values of the characteristic impedance and the electric length of the tuning stub as to six cases;

FIG. 15 is a plan view more specifically showing an exemplary structure of the voltage-controlled oscillator shown in FIG. 1;

DESCRIPTION OF THE PREFERRED EMBODIMENTS

Figure 1:
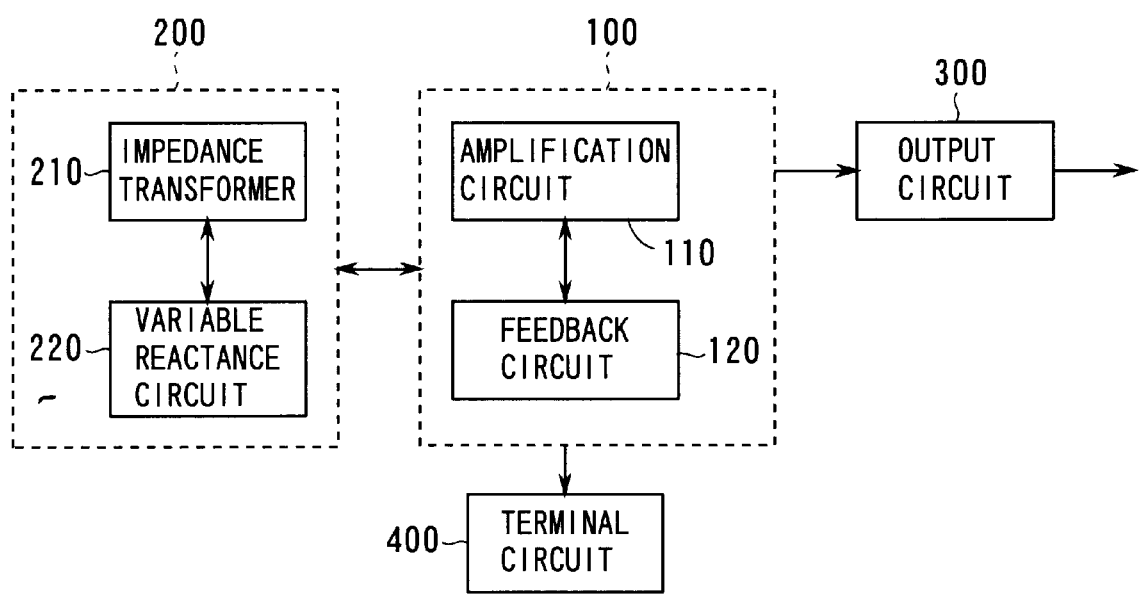
FIG. 1 is a block diagram showing the structure of a voltage-controlled oscillator according to an embodiment of the present invention.

FIG. 1 is a block diagram showing the structure of a voltage-controlled oscillator according to an embodiment of the present invention.

The voltage-controlled oscillator shown in FIG. 1 is formed by an oscillation part 100, a tuning part 200, an output circuit 300 and a terminal circuit 400.

The oscillation part 100, including an amplification circuit 110 and a feedback circuit 120, performs oscillation. The amplification circuit 110 is formed by an active element such as a transistor and a bias application circuit for the active element. The bias application circuit is band-limited to prevent passage of a prescribed frequency (oscillation frequency). The feedback circuit 120, forming a feedback loop along with the amplification circuit 110, returns an output signal from the amplification circuit 110 to an input side in the same phase and grows oscillation.

The tuning part 200 includes an impedance transformer 210 and a variable reactance circuit 220. The impedance transformer 210 includes a tuning stub formed by a transmission line (hereinafter referred to as an open stub) having an opened forward end or a transmission line (hereinafter referred to as a short stub) having a shorted forward end. The variable reactance circuit 220 is formed by a variable capacitance element such as a varactor diode and an inductor defined by a bonding wire or a wire. The oscillation frequency can be tuned by changing the reactance of the tuning part 200 and changing the phase quantity of the feedback loop.

The output circuit 300 is formed by a dc component removing circuit defined by a capacitor for removing a dc component, an attenuator for reducing load fluctuation and the like. The terminal circuit 400 consumes power of frequencies other than the oscillation frequency as heat, for stabilizing oscillation.

This voltage-controlled oscillator varies the oscillation frequency with a control voltage applied to the variable capacitance element of the variable reactance circuit 220.

In the voltage-controlled oscillator according to this embodiment, tuning sensitivity can be maximized by optimizing the impedance transformer 210 by a method described later. The term "tuning sensitivity" stands for the rate of change (width of change) of the oscillation frequency with respect to change of the control voltage.

Figure 2:
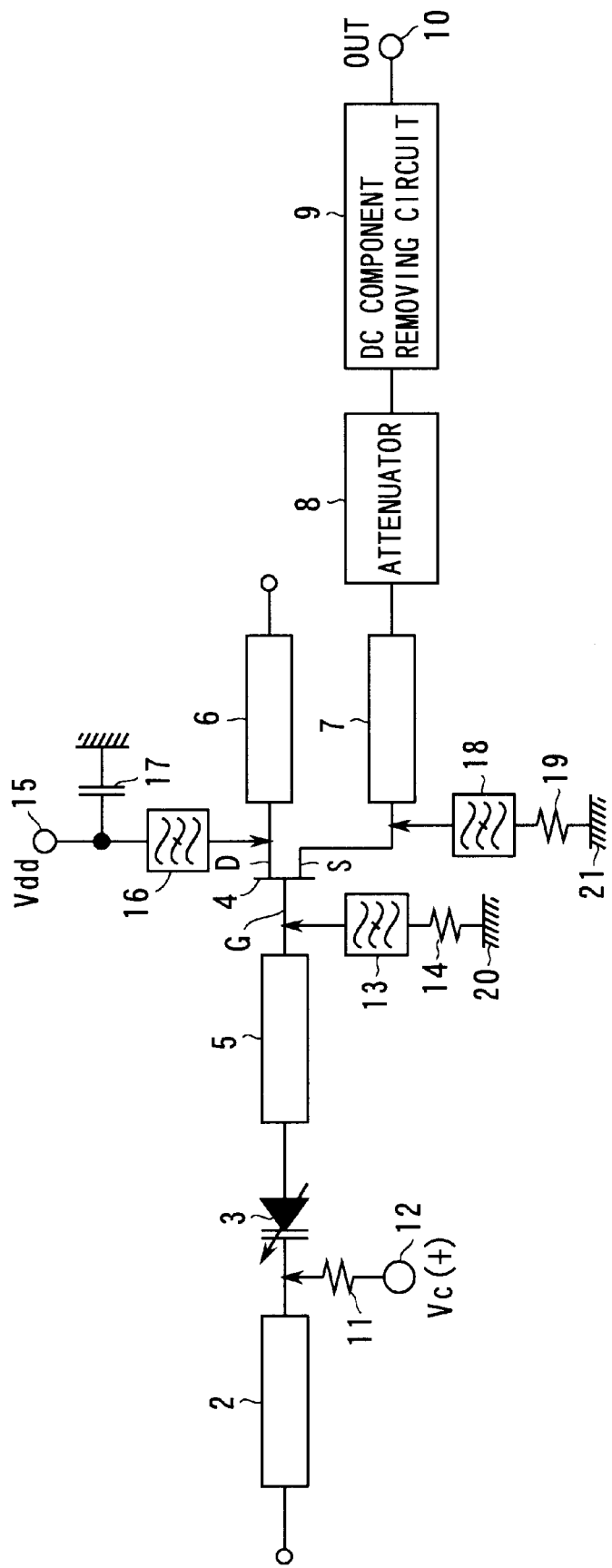
FIG. 2 is a circuit diagram showing an exemplary structure of the voltage-controlled oscillator shown in FIG. 1 in detail.
Figure 3:
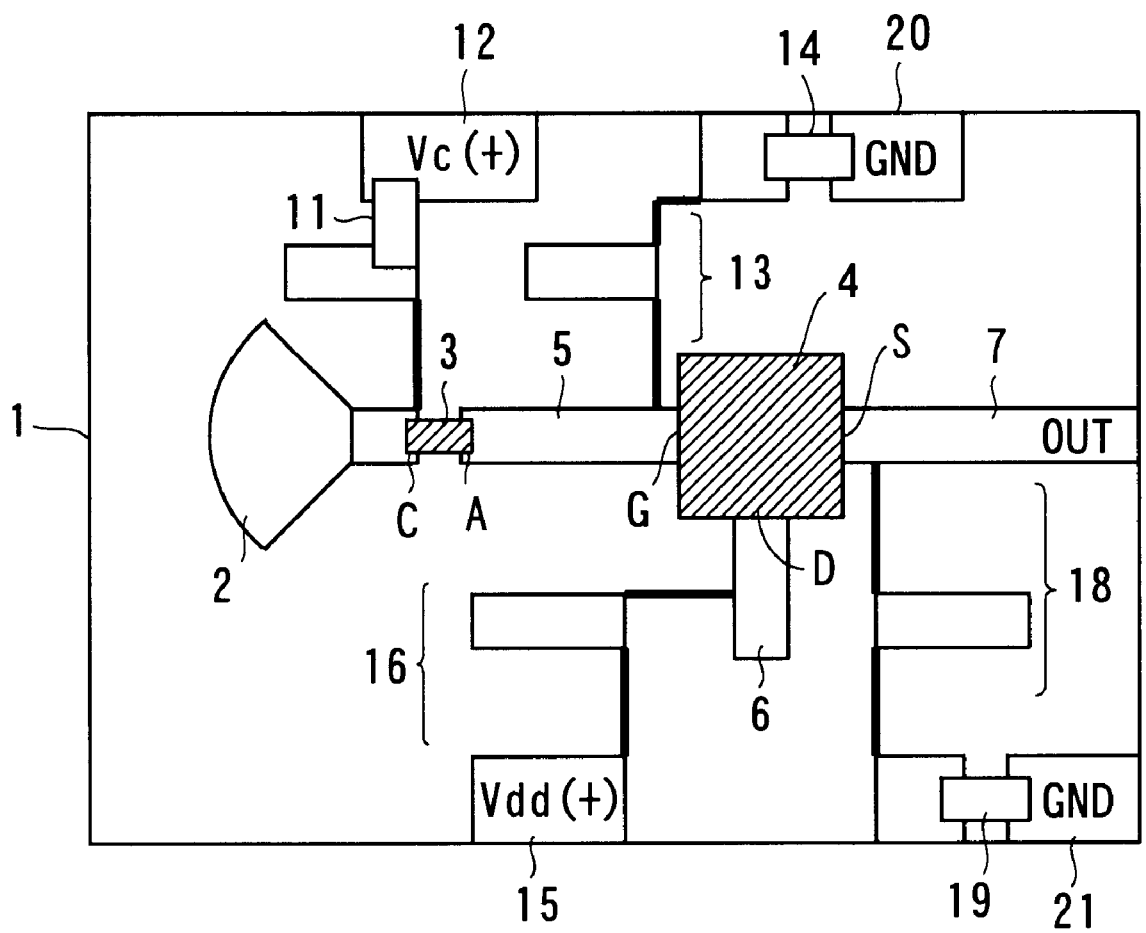
FIG. 3 is a plan view of the voltage-controlled oscillator shown in FIG. 2.

FIG. 2 is a circuit diagram showing an exemplary structure of the voltage-controlled oscillator shown in FIG. 1 in detail. FIG. 3 is a plan view of the voltage-controlled oscillator shown in FIG. 2. The voltage-controlled oscillator shown in FIGS. 2 and 3 is an internal feedback and self-biased voltage-controlled oscillator.

Referring to FIG. 3, a metal-semiconductor field-effect transistor (MESFET: hereinafter referred to as a transistor) 4 of GaAs is formed on a dielectric substrate 1. A grounding conductor is formed on the rear surface of the dielectric substrate 1. A gate-side feedback microstrip line 5, a drain-side feedback microstrip line 6 and an output microstrip line 7 are formed on the dielectric substrate 1. A gate electrode G, a drain electrode D and a source electrode S of the transistor 4 are connected to first ends of the gate-side feedback microstrip line 5, the drain-side feedback microstrip line 6 and the output microstrip line 7 respectively.

A sectorial tuning stub (radial stub) 2 is formed on the dielectric substrate 1. Low characteristic impedance can be readily implemented by employing the sectorial tuning stub 2. A second end of the microstrip line 5 is connected to an anode A of a varactor diode 3. A cathode C of the varactor diode 3 is connected to a first end of the tuning stub 2. In the example shown in FIG. 3, a second end of the tuning stub 2 is opened.

The cathode C of the varactor diode 3 is connected to a pad electrode 12 receiving a positive control voltage $V_C(+)$ through a control bias resistor 11. The control bias resistor 11 has a large resistance value of 10 kΩ, for example. Therefore, the control voltage $V_C(+)$ can be applied to the cathode C of the varactor diode 3 without leaking any signal.

The gate electrode G of the transistor 4 is connected to a pad electrode 20 receiving a ground potential GND through a band rejection filter 13 rejecting passage of a high frequency of the oscillation band and a terminal resistor 14.

A second end of the microstrip line 6 is opened. The drain electrode D of the transistor 4 is connected to a pad electrode 15 through a band rejection filter 16 rejecting passage of the high frequency of the oscillation band. The pad electrode 15 is grounded through a capacitor 17 (not shown in FIG. 3). A drain bias Vdd is applied to the pad electrode 15.

The source electrode S of the transistor 4 is connected to a pad electrode 21 receiving the ground potential GND through a band rejection filter 18 rejecting passage of the high frequency of the oscillation band and a self-bias resistor 19.

As shown in FIG. 2, a second end of the microstrip line 7 is connected to an output node 10 through an attenuator 8 and a dc component removing circuit 9. The dc component removing circuit 9 is formed by a capacitor. FIG. 3 illustrates neither the attenuator 8 nor the dc component removing circuit 9.

In the voltage-controlled oscillator shown in FIGS. 2 and 3, the transistor 4 forms the amplification circuit 110 shown in FIG. 1, and the microstrip lines 5, 6 and 7 form the feedback circuit 120. The tuning stub 2 forms the impedance transformer 210, and the varactor diode 3 forms the variable reactance circuit 220. The attenuator 8 and the dc component removing circuit 9 form the output circuit 300. The band rejection filter 16 and the capacitor 17 form a drain bias application circuit, while the band rejection filter 18 and the self-bias resistor 19 form a source bias application circuit. The band rejection filter 13 and the terminal resistor 14 form the terminal circuit 400.

Operations of the voltage-controlled oscillator shown in FIGS. 2 and 3 are now described. The transistor 4 amplifies a small microwave signal generated from the gate electrode G and outputs the same to the drain electrode D. The microwave signal having a prescribed frequency is totally reflected by the open end of the microstrip line 6, and fed back to the gate electrode G through capacities between the drain electrode D, the source electrode S and the gate electrode G. The microwave signal fed back to the gate electrode G is reflected by the node between the microstrip line 5 and the varactor diode 3 with phase change responsive to the impedance of the node. Thus, a feedback loop is formed at the prescribed frequency, and an output signal OUT oscillating at the prescribed frequency is obtained from the source electrode S of the transistor 4. When the control voltage $V_C(+)$ is varied, the capacitance value of the varactor diode 3 changes. Thus, the oscillation frequency changes.

Figure 4:
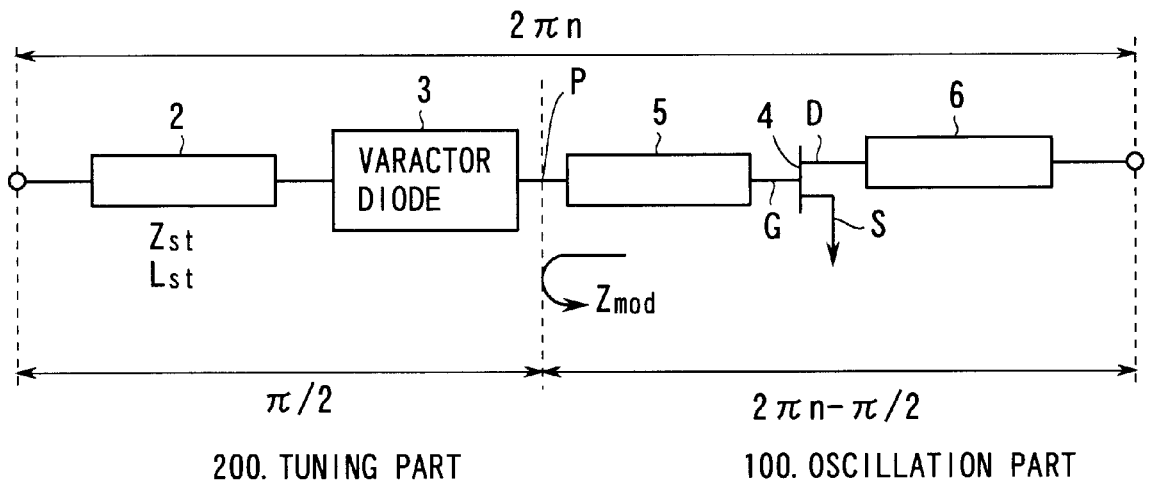
FIG. 4 is a circuit diagram noting the oscillation frequency of the voltage-controlled oscillator shown in FIG. 2.

FIG. 4 is a circuit diagram noting the oscillation frequency of the voltage-controlled oscillator shown in FIG. 2. In the following description, it is assumed that $f_n$ denotes the oscillation frequency.

Referring to FIG. 4, oscillation is performed under such a condition that the electric length (around phase) of the overall circuit of the voltage-controlled oscillator at the oscillation frequency $f_n$, i.e., the electric length between the open ends of the tuning stub 2 and the microstrip line 6 is integral times $2\pi$ and the gain exceeds 1.

The characteristic impedance $Z_{st}$ and the length $L_{st}$ of the tubing stub 2 are so set that the impedance $Z_{mod}$ of the tuning part 200 as viewed from the node P between the oscillation part 100 and the tuning part 200 reaches zero at the oscillation frequency $f_n$, i.e., the node P is shorted at the oscillation frequency $f_n$. Thus, the electric length of the tuning part 200 at the oscillation frequency $f_n$ is $(\pi/2)$ rad. The electric length of the oscillation part 100 at the oscillation frequency $f_n$ is $(2\pi n-\pi/2)$ rad, where n denotes a positive integer.

Figure 5:
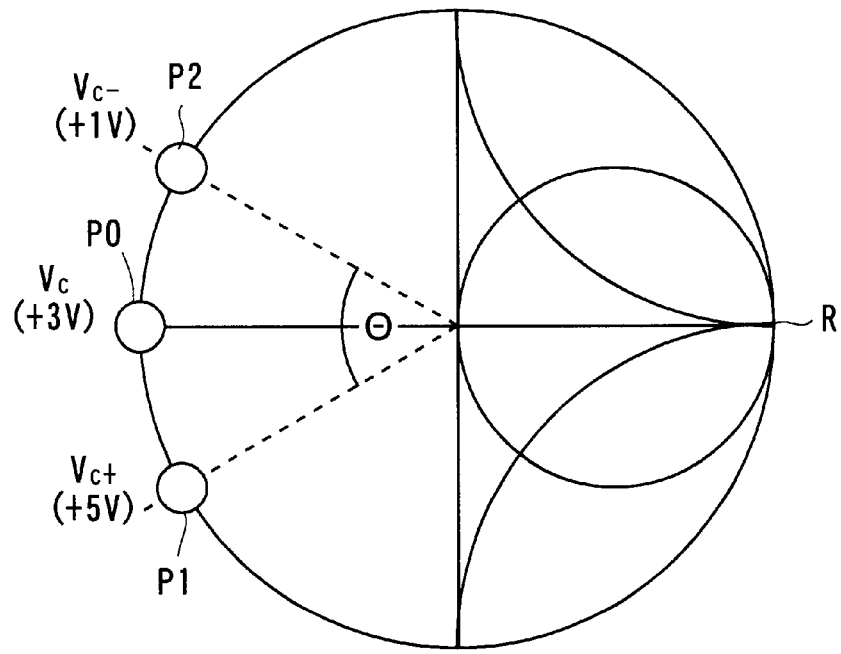
FIG. 5 is a Smith chart showing control voltage dependency of impedance at the oscillation frequency of a tuning part shown in FIG. 4.

FIG. 5 is a Smith chart showing control voltage dependency of the impedance of the tuning part 200 shown in FIG. 4 at the oscillation frequency $f_n$.

Referring to FIG. 5, it is assumed that $X_{mod}$ denotes the reactance of the tuning part 200 at the oscillation frequency $f_n$ as viewed from the node P between the oscillation part 100 and the tuning part 200. Assuming that the resistance component of the tuning part 200 is zero, the impedance $Z_{mod}$ of the tuning part 200 at the oscillation frequency $f_n$ is equal to the reactance $X_{mod}$ at the oscillation frequency $f_n$.

It is assumed that $V_C$ denotes the central value (hereinafter referred to as a central control voltage) of the control voltage $V_C(+)$ applied to the cathode C of the varactor diode 3 with an upper limit $V_{C+}$ and a lower limit $V_{C-}$. In this example, the central control voltage $V_C$ is +3 V, the upper limit $V_{C+}$ of the control voltage $V_C(+)$ is +5 V, and the lower limit $V_{C-}$ of the control voltage $V_C(+)$ is +1 V.

Referring to FIG. 5, the right point R denotes the reactance at the open end of the tuning stub 2. The right points P0, P1 and P2 denote the reactance values at the central control voltage $V_C$, the upper limit $V_{C+}$ and the lower limit $V_{C-}$ of the control voltage $V_C(+)$ respectively.

When the control voltage $V_C(+)$ changes from the lower limit $V_{C-}$ to the upper limit $V_{C+}$ and the locus of the impedance $Z_{mod}$ includes the point P0 of reactance zero (short) and the reactance substantially reaches zero at the central control voltage $V_C$, change ($\theta$) of the phase with respect to change of the reactance $X_{mod}$ is increased, as shown in FIG. 5. Thus, the rate of change of the oscillation frequency $f_n$ with respect to change of the control voltage $V_C(+)$ can be increased. Therefore, the parameters of the tuning stub 2 are so set that the node P between the oscillation part 100 and the tuning part 200 is shorted when the control voltage $V_C(+)$ is at the central control voltage $V_C$.

Methods of optimizing the impedance transformer 210 are now described.

(1) First Optimization Method

The impedance transformer 210 of the tuning part 200 can be formed by employing an open stub (line having an open forward end) or a short stub (line having a shorted forward end) as the tuning stub 2.

Figure 6:
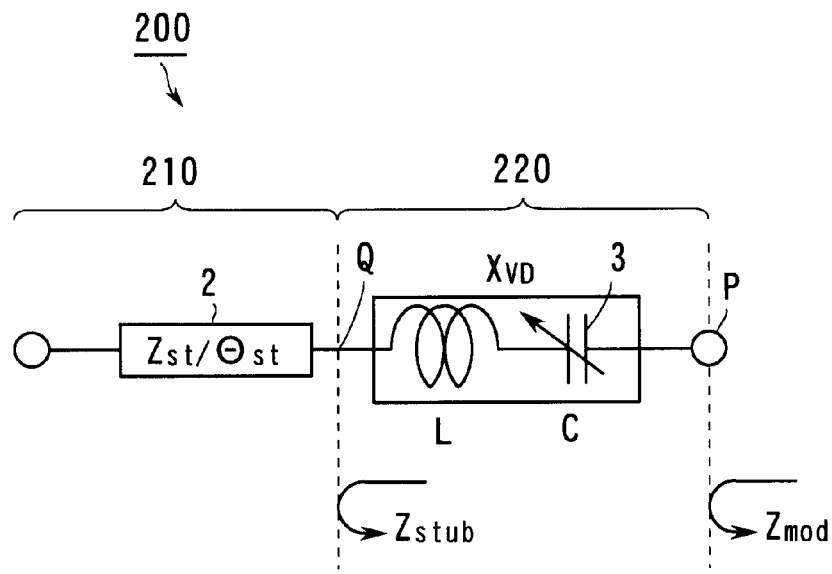
FIG. 6 illustrates a tuning part employing an open stub.
Figure 7:
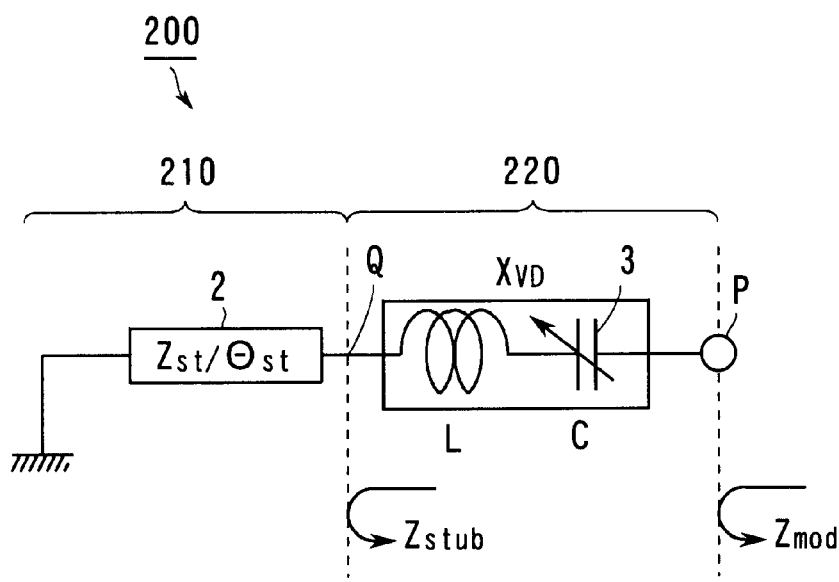
FIG. 7 illustrates a tuning part employing a short stub.

FIG. 6 illustrates a tuning part 200 employing an open stub, and FIG. 7 illustrates a tuning part 200 employing a short stub.

Referring to each of FIGS. 6 and 7, the varactor diode 3 is equivalently simplified to a variable capacitor and a fixed inductor. Symbol L denotes an inductive (inductor) component such as a bonding wire or a pad, and symbol C denotes a capacitive (capacitor) component such as a capacitor or a parasitic capacitor of the varactor diode 3.

The impedance transformer 210 is so designed that the impedance $Z_{mod}$ and the reactance $X_{mod}$ of the tuning part 200 are equal to j and 0 respectively when the control voltage $V_C(+)$ is at the central control voltage $V_C$.

At this time, four cases are assumed in response to the structure (open or short stub) of the impedance transformer 210 and the characteristic (capacitive or inductive) of the variable reactance circuit 220, for obtaining optimization conditions for maximizing tuning sensitivity in the respective cases.

It is assumed that A denotes the inductive component of the variable reactance circuit 220, and B denotes the capacitive component of the variable reactance circuit 220. The value of the inductive component A is regularly constant while the value of the capacitive component B, which is variable, is assumed to be that at the central control voltage $V_C$. It is also assumed that $\alpha$ (=A/B) denotes the ratio of the inductive component A to the capacitive component B of the variable reactance circuit 220. The reactance $X_{VD}$ of only the variable reactance circuit 220 at the central control voltage $V_C$ is (A–B).

It is further assumed that $Z_{stub}$ denotes the characteristic impedance of the tuning stub 2 as viewed from the node Q between the varactor diode 3 and the tuning stub 2.

In the following description, $\omega_x$ denotes an oscillation angular frequency at an arbitrary control voltage $V_x$, $\omega_C$ denotes an oscillation angular frequency (center oscillation angular frequency) at the central control voltage $V_C$, and $\omega_n$ denotes an oscillation angular frequency normalized with the oscillation angular frequency $\omega_C$, where $\omega_n=\omega_x/\omega_C$.

$C_x$ denotes the capacity of the varactor diode 3 at the control voltage $V_x$, and $C_n$ denotes the capacity of the varactor diode 3 normalized with the capacity $C_C$, where $C_n=C_x/C_C$. At the central control voltage $V_C$, $\omega_n=1$ and $C_n=1$.

$Z_{st}$ denotes the characteristic impedance [$\Omega$] of the tuning stub 2, and $\theta_{st}$ denotes the electric length [rad] of the tuning stub 2 at the center oscillation angular frequency $\omega_C$.

(Open Stub)

In the case of the open stub, the characteristic impedance $Z_{st}$ is expressed as follows:

$$Z_{st}=B(\alpha-1)\tan\theta_{st}=(A-B)\tan\theta_{st} \quad (A1)$$

It is assumed that $C_n(\omega_n)$ denotes the capacity of the varactor diode 3 at the oscillation angular frequency $\omega_n$. At the central control voltage $V_C$ ($\omega_n=1$), the rate $C_n'(\omega_n)$ of change of the capacity $C_n(\omega_n)$ of the varactor diode 3 is expressed as follows:

$$C_n'(1)=(1-\alpha)\cdot\{2\theta_{st}/\sin(2\theta_{st})\}-(1+\alpha) \quad (A2)$$

The capacity $C_n(\omega_n)$ indicates that the capacity $C_n$ is a function of the oscillation angular frequency $\omega_n$. The rate $C_n'(\omega_n)$ of change, obtained by differentiating the capacity $C_n(\omega_n)$ by the oscillation angular frequency $\omega_n$, expresses the rate of change of the capacity of the varactor diode 3 with respect to change of the oscillation angular frequency $\omega_n$. A method of deriving the above equation (A2) is described later.

Figure 8:
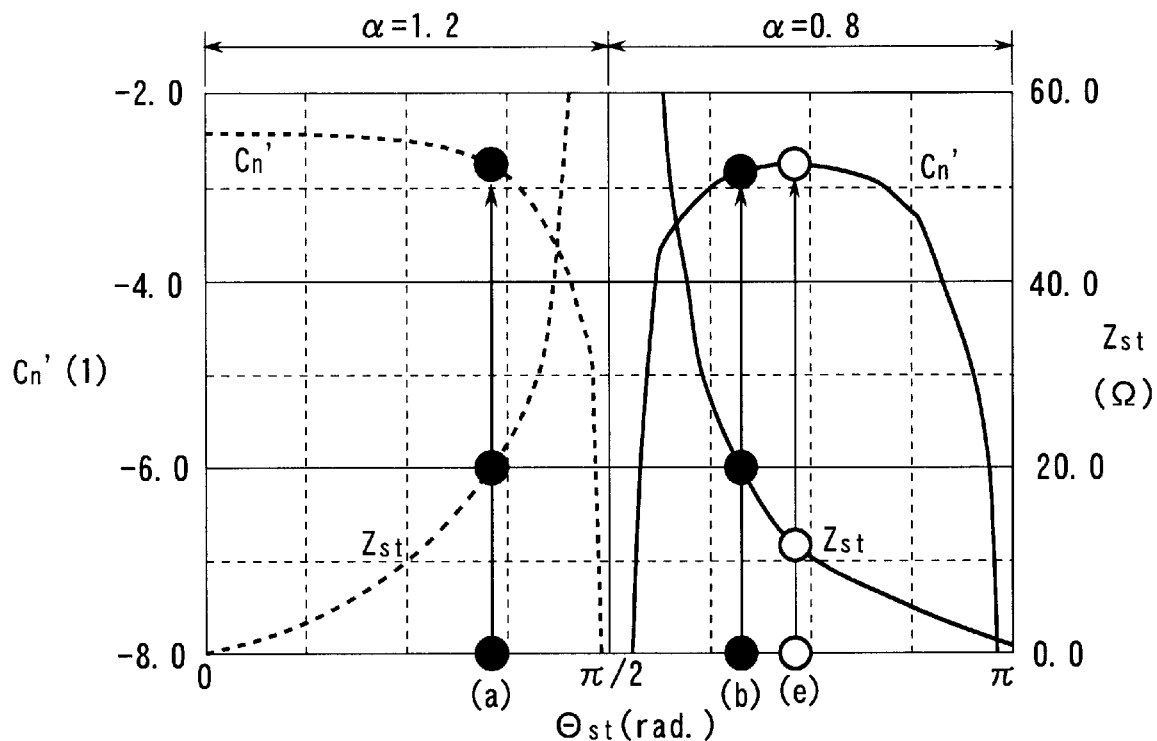
FIG. 8 illustrates the relation between the electric length of an open tuning stub at a center oscillation angular frequency, the characteristic impedance of the tuning stub and the rate of change of the capacity of a varactor diode.

FIG. 8 shows the relation between the electric length $\theta_{st}$ of the tuning stub 2, the characteristic impedance $Z_{st}$ of the tuning stub 2 and the rate $C_n'(1)$ of change of the capacity of the varactor diode 3 with reference to the tuning stub 2 formed by an open stub at the center oscillation angular frequency $\omega_C$. The rate $C_n'(1)$ of change is negative since the capacity $C_n$ is reduced as the oscillation angular frequency is increased.

It is assumed that the ratio $\alpha$ is equal to 1.2 when the variable reactance circuit 220 is inductive ($\alpha>1$), and the ratio $\alpha$ is equal to 0.8 when the variable reactance circuit 220 is capacitive ($\alpha<1$).

It is understood from FIG. 8 that the rate $C_n'(1)$ of change of the capacity of the varactor diode 3 is reduced as the characteristic impedance $Z_{st}$ of the tuning stub 2 is reduced when the variable reactance circuit 220 is inductive ($\alpha>1$). Therefore, the characteristic impedance $Z_{st}$ of the tuning stub 2 is preferably set to the minimum value.

If the implementable characteristic impedance $Z_{st}$ of the tuning stub 2 is limited due to a reason in fabrication or the like, however, the characteristic impedance $Z_{st}$ of the tuning stub 2 is minimized within the limit.

If the variable reactance circuit 220 is capacitive ($\alpha<1$), the rate $C_n'(1)$ of change of the capacity of the varactor diode 3 has the minimum value when the electric length $\theta_{st}$ is substantially at $(23\pi/32)$ [rad]. Therefore, the characteristic impedance $Z_{st}$ of the tuning stub 2 is preferably substantially $-1.22$ times the reactance $X_{VD}$ (=A−B), where $-1.22$ is the value of tan $\theta_{st}$ when the electric length $\theta_{st}$ is equal to $(23\pi/32)$ [rad].

If the implementable characteristic impedance $Z_{st}$ of the tuning stub 2 is limited, however, the characteristic impedance $Z_{st}$ of the tuning stub 2 is set as close as possible to $-1.22$ times the reactance $X_{VD}$ (=A−B) within the limit.

The electric length $\theta_{st}$ of the tuning stub 2 may be slightly displaced from $(23\pi/32)$ [rad] when the rate $C_n'(1)$ of change of the capacity of the varactor diode 3 has the minimum value. In this case, the characteristic impedance $Z_{st}$ of the tuning stub 2 may be set to a value slightly displaced from $-1.22$ times the reactance $X_{VD}$.

The characteristic impedance $Z_{st}$ of the tuning stub 2 may be set to tan$(23\pi/32)$ times the reactance $X_{VD}$ of the variable reactance circuit 220 at the central control voltage $V_C$, or within the range between $\tan\{(23\pi/32)-(\pi/10)\}$ times and $\tan\{(23\pi/32)+(\pi/10)\}$ times the reactance $X_{VD}$ of the variable reactance circuit 220. The electric length $\theta_{st}$ of the tuning stub 2 may be set to $(23\pi/32)$ [rad], or within the range between $\tan\{(23\pi/32)-(\pi/10)\}$ [rad] and $\tan\{(23\pi/32)+(\pi/10)\}$ [rad].

(Short Stub)

In the case of a short stub, the characteristic impedance $Z_{st}$ is expressed as follows:

$$Z_{st}=B(1-\alpha)\cot\theta_{st}=-(A-B)\cot\theta_{st} \quad (B1)$$

It is assumed that $C_n(\omega_n)$ denotes the capacity of the varactor diode 3 at the oscillation angular frequency $\omega_n$. At the central control voltage $V_C$ ($\omega_n=1$), the rate $C_n'(\omega_n)$ of change of the capacity $C_n(\omega_n)$ of the varactor diode 3 is expressed as follows:

$$C_n'(1)=(\alpha-1)\cdot\{2\theta_{st}/\sin(2\theta_{st})\}-(1+\alpha) \quad (B2)$$

The capacity $C_n(\omega_n)$ indicates that the capacity $C_n$ is a function of the oscillation angular frequency $\omega_n$. The rate $C_n'(\omega_n)$ of change, obtained by differentiating the capacity $C_n(\omega_n)$ by the oscillation angular frequency $\omega_n$, expresses the rate of change of the capacity of the varactor diode 3 with respect to change of the oscillation angular frequency $\omega_n$. A method of deriving the above equation (B2) is described later.

Figure 9:
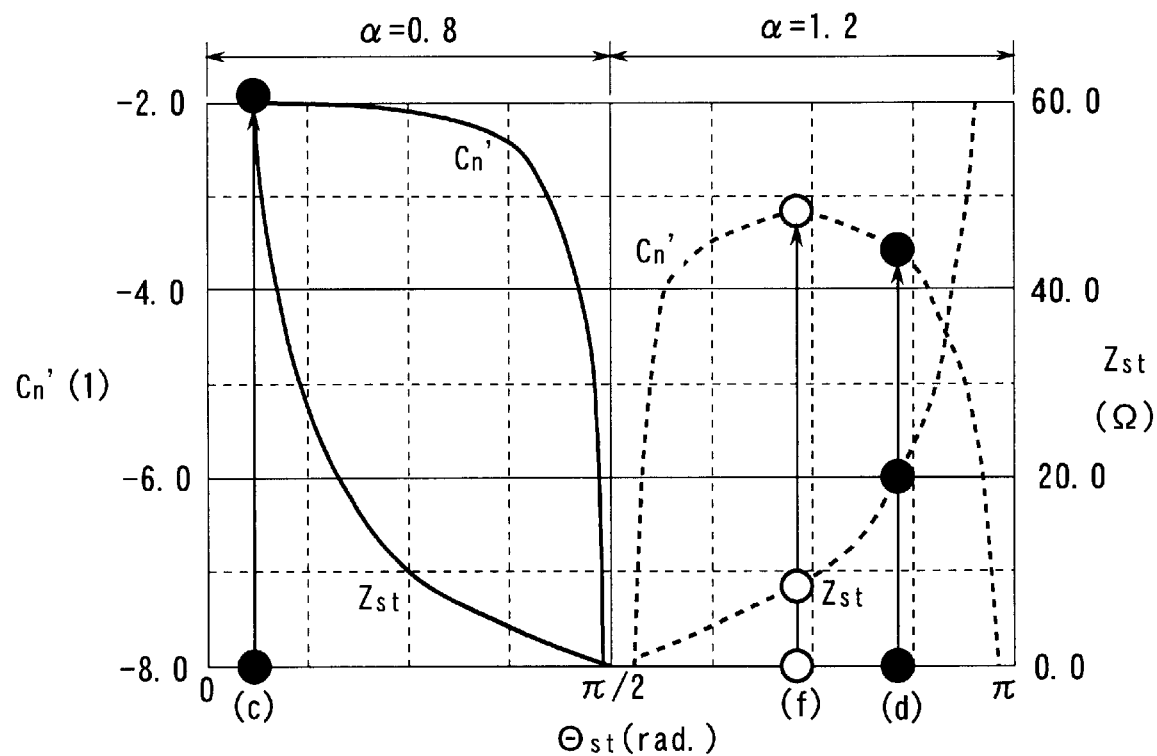
FIG. 9 illustrates the relation between the electric length of a short tuning stub at a center oscillation angular frequency, the characteristic impedance of the tuning stub and the rate of change of the capacity of a varactor diode.

FIG. 9 shows the relation between the electric length $\theta_{st}$ of the tuning stub 2, the characteristic impedance $Z_{st}$ of the tuning stub 2 and the rate $C_n'(1)$ of change of the varactor 4 diode 3 with reference to the tuning stub 2 formed by a short stub. The rate $C_n'(1)$ of change of the capacity is negative since the capacity $C_n$ is reduced as the oscillation angular frequency $\omega_n$ is increased.

It is assumed that the ratio $\alpha$ is equal to 1.2 when the variable reactance circuit 220 is inductive ($\alpha>1$), and the ratio $\alpha$ is equal to 0.8 when the variable reactance circuit 220 is capacitive ($\alpha<1$).

It is understood from FIG. 9 that the rate $C_n'(1)$ of change of the capacity of the varactor diode 3 has the minimum value when the electric length $\theta_{st}$ is substantially $(23\pi/32)$ [rad] if the variable reactance circuit 220 is inductive ($\alpha>1$). Therefore, the characteristic impedance $Z_{st}$ of the tuning stub 2 is preferably substantially 0.82 times the reactance $X_{VD}$ (=A−B), where 0.82 is the value of cot $\theta_{st}$ when the electric length $\theta_{st}$ is equal to $(23\pi/32)$ [rad].

If the implementable characteristic impedance $Z_{st}$ of the tuning stub 2 is limited due to a reason in fabrication or the like, however, the characteristic impedance $Z_{st}$ of the tuning stub 2 is set as close as possible to 0.82 times the reactance $X_{VD}$ (=A−B) within the limit.

The electric length $\theta_{st}$ of the tuning stub 2 maybe slightly displaced from $(23\pi/32)$ [rad] when the rate $C_n'(1)$ of change of the capacity of the varactor diode 3 has the minimum value. In this case, the characteristic impedance $Z_{st}$ of the tuning stub 2 may be set to a value slightly displaced from 0.82 times the reactance $X_{VD}$.

The characteristic impedance $Z_{st}$ of the tuning stub 2 may be set to cot $(23\pi/32)$ times the reactance $X_{VD}$ of the variable reactance circuit 220 at the central control voltage $V_C$, or within the range between cot $\{(23\pi/32)-(\pi/10)\}$ times and cot $\{(23\pi/32)+(\pi/10)\}$ times the reactance $X_{VD}$ of the variable reactance circuit 220. The electric length $\theta_{st}$ of the tuning stub 2 may be set to $(23\pi/32)$ [rad], or within the range between cot $\{(23\pi/32)-(\pi/10)\}$ [rad] and cot $\{(23\pi/32)+(\pi/10)\}$ [rad].

If the variable reactance circuit 220 is capacitive ($\alpha<1$), the rate $C_n'(1)$ of change of the capacity of the varactor diode 3 is reduced as the characteristic impedance $Z_{st}$ of the tuning stub 2 is increased. Therefore, the characteristic impedance $Z_{st}$ of the tuning stub 2 is preferably maximized.

If the implementable characteristic impedance $Z_{st}$ of the tuning stub 2 is limited, however, the characteristic impedance $Z_{st}$ of the tuning stub 2 is set to the maximum within the limit.

FIG. 10 shows optimum values of the characteristic impedance $Z_{st}$ of the tuning stub 2 and the electric length $\theta_{st}$ of the tuning stub 2 as to six cases (a) to (f).

The central oscillation frequency $f_n$ is 10 GHz. The inductive component A is equal to $\omega\cdot L=2\pi f_n L$, and the capacitive component B is equal to $1/(\omega\cdot C)=1/2\pi f_n C$.

In the cases (a) to (d), the characteristic impedance $Z_{st}$ is limited to 20 to 60Ω. In the cases (e) and (f), the characteristic impedance $Z_{st}$ is not limited. The tuning stub 2 is formed by an open stub in the cases (a), (b) and (e), and formed by a short stub in the cases (c), (d) and (f).

It is assumed that the capacitive component B is 50 [Ω] in all cases (a) to (f). The inductive component A is 60 [Ω] and the variable reactance circuit 220 is inductive ($\alpha>1$) in the cases (a), (d) and (f). The inductive component A is 40 [Ω] and the variable reactance circuit 220 is capacitive ($\alpha<1$) in the cases (b), (c) and (e).

In the case (a), the optimum value of the characteristic impedance $Z_{st}$ reaches the lower limit of 20Ω when the electric length $\theta_{st}$ is 1.107 rad. In the case (b), the optimum value of the characteristic impedance $Z_{st}$ reaches the lower limit of 20Ω when the electric length $\theta_{st}$ is 2.034 rad. In the case (c), the optimum value of the characteristic impedance $Z_{st}$ reaches the upper limit of 60Ω when the electric length $\theta_{st}$ is 0.165 rad. In the case (d), the optimum value of the characteristic impedance $Z_{st}$ reaches the lower limit of 20Ω when the electric length $\theta_{st}$ is 2.678 rad.

In the case (e), the optimum value of the characteristic impedance $Z_{st}$ reaches 12.2Ω when the electric length $\theta_{st}$ is $(23\pi/32)$ rad. In the case (f), the optimum value of the characteristic impedance $Z_{st}$ reaches 8.2Ω when the electric length $\theta_{st}$ is (23π/32) rad.

(2) Second Optimization Method (Open Stub)

The reactance $X_{VD}$ (=A−B) of only the variable reactance circuit 220 at the central control voltage $V_C$ is set substantially to zero. Thus, the rate $C_n'(1)$ of change of the capacity of the varactor diode 3 is minimized to −2 regardless of the characteristic impedance $Z_{st}$ of the tuning stub 2 when the tuning stub 2 is formed by an open stub. In this case, the tuning part 200 serially resonates at the center oscillation angular frequency $\omega_C$, and tuning sensitivity is maximized. The characteristic impedance $Z_{st}$ of the tuning stub 2 is arbitrary, and the electric length $\theta_{st}$ of the tuning stub 2 is substantially (π/2) rad.

In order to set the reactance $X_{VD}$ (=A−B) of only the variable reactance circuit 220 at the central control voltage $V_C$ substantially to zero, a fixed capacitor is added to the varactor diode 3 in a serial or parallel manner, or an inductor formed by a bonding wire or a wire is adjusted.

The electric length $\theta_{st}$ of the tuning stub 2 may be set to (π/2) rad, or set within the range between {(π/2)−(π/10)} rad and {(π/2)+(π/10)} rad.

(Short Stub)

The reactance $X_{VD}$ (=A−B) of only the variable reactance circuit 220 at the central control voltage $V_C$ is set substantially to zero. Thus, the rate $C_n'(1)$ of change of the capacity of the varactor diode 3 is minimized to −2 regardless of the characteristic impedance $Z_{st}$ of the tuning stub 2 when the tuning stub 2 is formed by a short stub. In this case, the tuning part 200 serially resonates at the center oscillation angular frequency $\omega_C$, and tuning sensitivity is maximized. The characteristic impedance $Z_{st}$ of the tuning stub 2 is arbitrary, and the electric length $\theta_{st}$ of the tuning stub 2 is substantially 0 rad.

In order to set the reactance $X_{VD}$ (=A−B) of only the variable reactance circuit 220 at the central control voltage $V_C$ substantially to zero, a fixed capacitor is added to the varactor diode 3 in a serial or parallel manner, or an inductor formed by a bonding wire or a wire is adjusted.

The electric length $\theta_{st}$ of the tuning stub 2 may be set to 0 rad, or set within the range between 0 rad and (π/10) rad.

Figure 11:
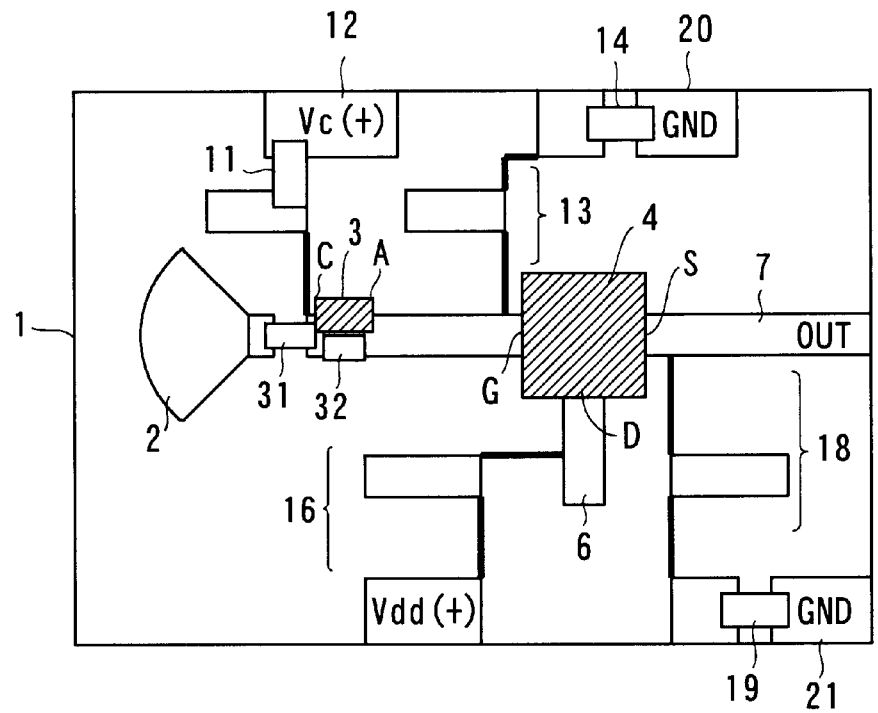
FIG. 11 is a plan view of a voltage-controlled oscillator employing a second optimization method.

FIG. 11 is a plan view of a voltage-controlled oscillator employing the second optimization method. In the voltage-controlled oscillator shown in FIG. 11, a fixed capacitor 31 is connected between a cathode C of a varactor diode 3 and a tuning stub 2, and another fixed capacitor 32 is connected in parallel with the varactor diode 3.

Thus, the reactance $X_{VD}$ (=A−B) of only a variable reactance circuit 220 at the central control voltage $V_C$ is set substantially to zero. The electric length $\theta_{st}$ of the tuning stub 2 is set substantially to (π/2) rad.

The remaining parts of the voltage-controlled oscillator shown in FIG. 11 are similar in structure to those of the voltage-controlled oscillator shown in FIG. 3.

The relation between the oscillation angular frequency $\omega_n$ and the capacity $C_n$ of the varactor diode 3 was investigated in voltage-controlled oscillators according to Inventive Examples 1 and 2 and comparative example.

The voltage-controlled oscillators according to Inventive Examples 1 and 2 have the structures shown in FIGS. 3 and 11 respectively.

Figure 12:
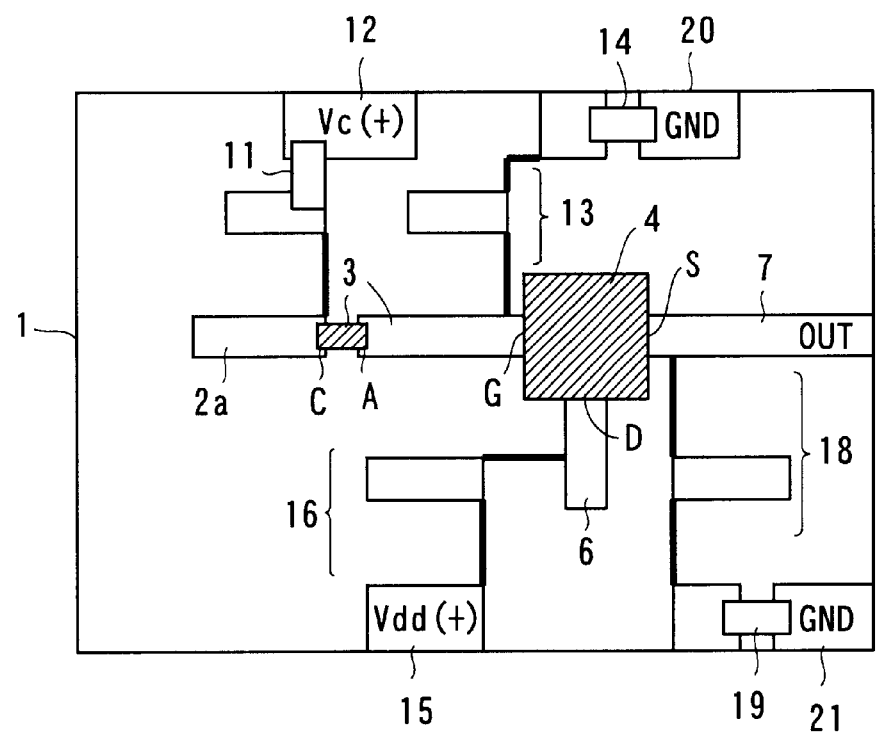
FIG. 12 is a plan view of a voltage-controlled oscillator according to comparative example.

FIG. 12 is a plan view showing the voltage-controlled oscillator according to comparative example. The voltage-controlled oscillator shown in FIG. 12 is provided with a linear tuning stub 2a in place of the sectorial tuning stub 2. The remaining parts of the voltage-controlled oscillator shown in FIG. 12 are similar in structure to those of the voltage-controlled oscillator shown in FIG. 3.

The characteristic impedance $Z_{st}$ of the tuning stub 2 of the variable reactance circuit 220 was set to 20Ω in Inventive Example 1, while the characteristic impedance $Z_{st}$ of the tuning stub 2a was set to 50Ω in comparative example. In comparative example, the electric length $\theta_{st}$ of the tuning stub 2a was 1.373 rad (78.7 deg).

In Inventive Example 2, the ratio α (A/B) was set to 1 by either one of the following two methods, and the electric length $\theta_{st}$ of the tuning stub 2 was set to (π/2) rad. The characteristic impedance $Z_{st}$ of the tuning stub 2 was arbitrary. In this case, the capacity $C_n$ was equal to $1/\omega_n^2$, and the rate of change of the oscillation angular frequency $\omega_n$ was maximized.

For example, the inductive component A is set to 60 [Ω] and the fixed capacitor 31 of 1.59 pH is serially added to the varactor diode 3 so that the total of the capacitance values of the varactor diode 3 and the fixed capacitor 31 is 0.265 pH, thereby setting the capacitive component B to 60 [Ω]. Thus, the inductive and capacitive components A and B are equally set to 60 [Ω]. Alternatively, the capacitive component B is set to 50 [Ω] and the inductive component L is set to 0.796 nH by reducing the length of the bonding wire of the variable reactance circuit 220, thereby setting the inductive component A to 50 [Ω]. Thus, the inductive and capacitive components A and B are equally set to 50 [Ω].

Figure 13:
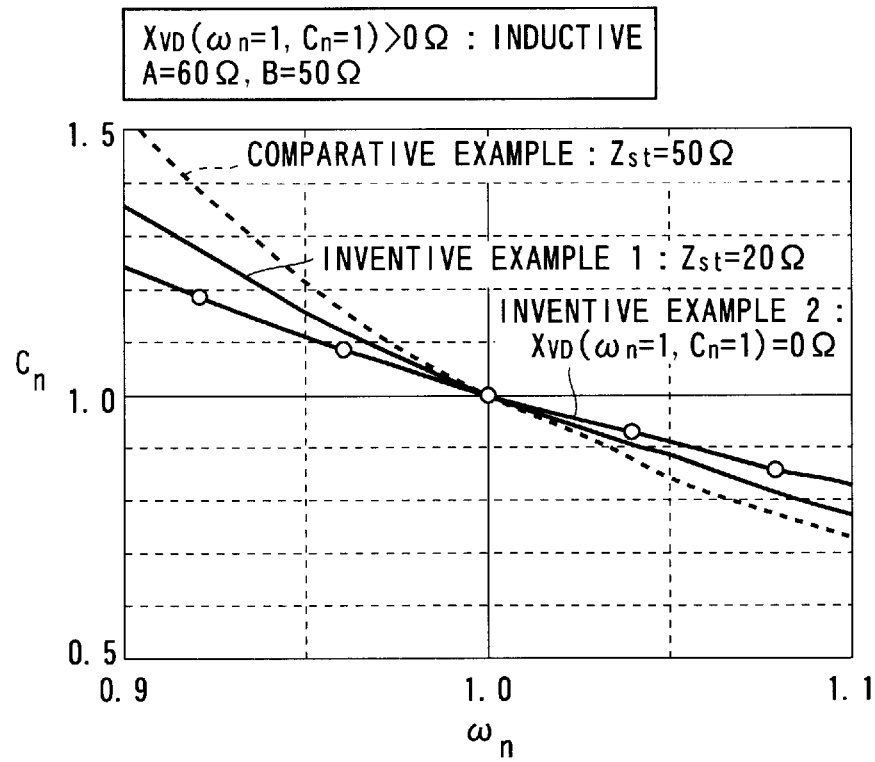
FIG. 13 and FIG. 14 illustrate the relation between oscillation angular frequencies and capacities of varactor diodes in capacitive voltage-controlled oscillators according to Inventive Examples 1 and 2 and comparative example.
Figure 14:
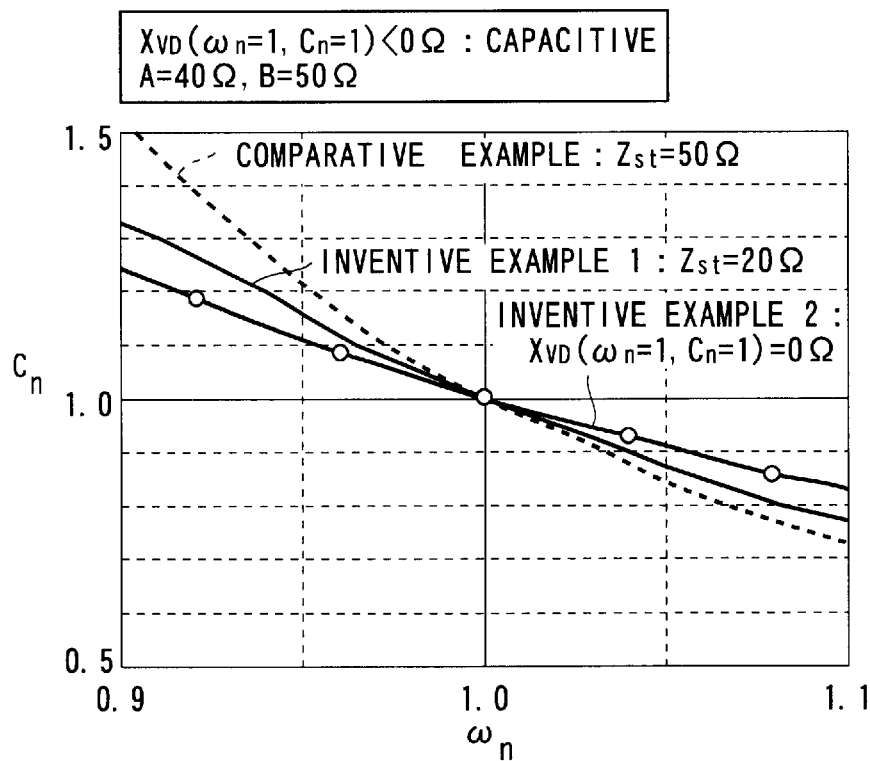

FIGS. 13 and 14 illustrate the relation between the oscillation angular frequency $\omega_n$ and the capacity $C_n$ of the varactor diode 3 in Inventive examples 1 and 2 and comparative example. The variable reactance circuit 220 according to Inventive example is inductive in FIG. 13 and capacitive in FIG. 14.

Referring to FIG. 13, Inventive Example 1 having the inductive variable reactance circuit 220 corresponds to the case (a) shown in FIG. 10 with the inductive and capacitive components A and B of 60 [Ω] and 50 [Ω] respectively and the reactance $X_{VD}$ ($\omega_n$=1 and $C_n$=1) of the variable reactance circuit 220 equal to A−B>0 at the central control voltage $V_C$.

Referring to FIG. 14, Inventive Example 1 having the inductive variable reactance circuit 220 corresponds to the case (b) shown in FIG. 10 with the inductive and capacitive components A and B of 40 [Ω] and 50 [Ω] respectively and the reactance $X_{VD}$ ($\omega_n$=1 and $C_n$=1) of the variable reactance circuit 220 equal to A−B<0 at the central control voltage $V_C$.

It is understood from FIGS. 13 and 14 that the rate of change of the capacity $C_n$ necessary for tuning the oscillation frequency in the range of 9.0 to 11.0 GHz with reference to 10 GHz is 0.78 to 1.35 in Inventive Example 1 and 0.74 to 1.52 in comparative example. In other words, Inventive Example 1 attains the same tuning range as comparative example with small change of the capacity $C_n$ of the varactor diode 3.

In Inventive Example 2, the rate of change of the capacity $C_n$ necessary for tuning the oscillation frequency in the range of 9.0 to 11.0 GHz with reference to 10 GHz is 0.84 to 1.24. In other words, Inventive Example 2 attains the same tuning range as Inventive Example 1 and comparative example with smaller change of the capacity $C_n$ of the varactor diode 3.

In the voltage-controlled oscillator according to this embodiment, as hereinabove described, the rate of change (width of change) of the oscillation frequency is increased with respect to change of the capacity $C_n$ of the varactor diode 3. In other words, the rate of change (width of change) of the oscillation frequency is increased with respect to change of the control voltage. Therefore, a broadband tuning range can be attained.

Further, a desired range can be selected from the broadband tuning range, whereby the tuning range can be optimized.

In addition, a range having excellent linearity of the capacity-control voltage characteristic of the varactor diode 3 can be selectively used due to the broadband tuning range. Thus, linearity of change of the oscillation frequency is improved with respect to change of the control voltage for the voltage-controlled oscillator.

The necessary tuning range can be ensured with small change of the capacity $C_n$ of the varactor diode 3, whereby capacity change in the tuning range as well as a series resistance component of the varactor diode 3 are reduced. Therefore, fluctuation of the phase noise characteristic resulting from change of the oscillation frequency is reduced.

Further, the Q-value of the tuning part 200 as well as the phase noise characteristic are improved by performing tuning in a region (deep bias region) of the control voltage providing a small series resistance component of the varactor diode 3.

Figure 16:
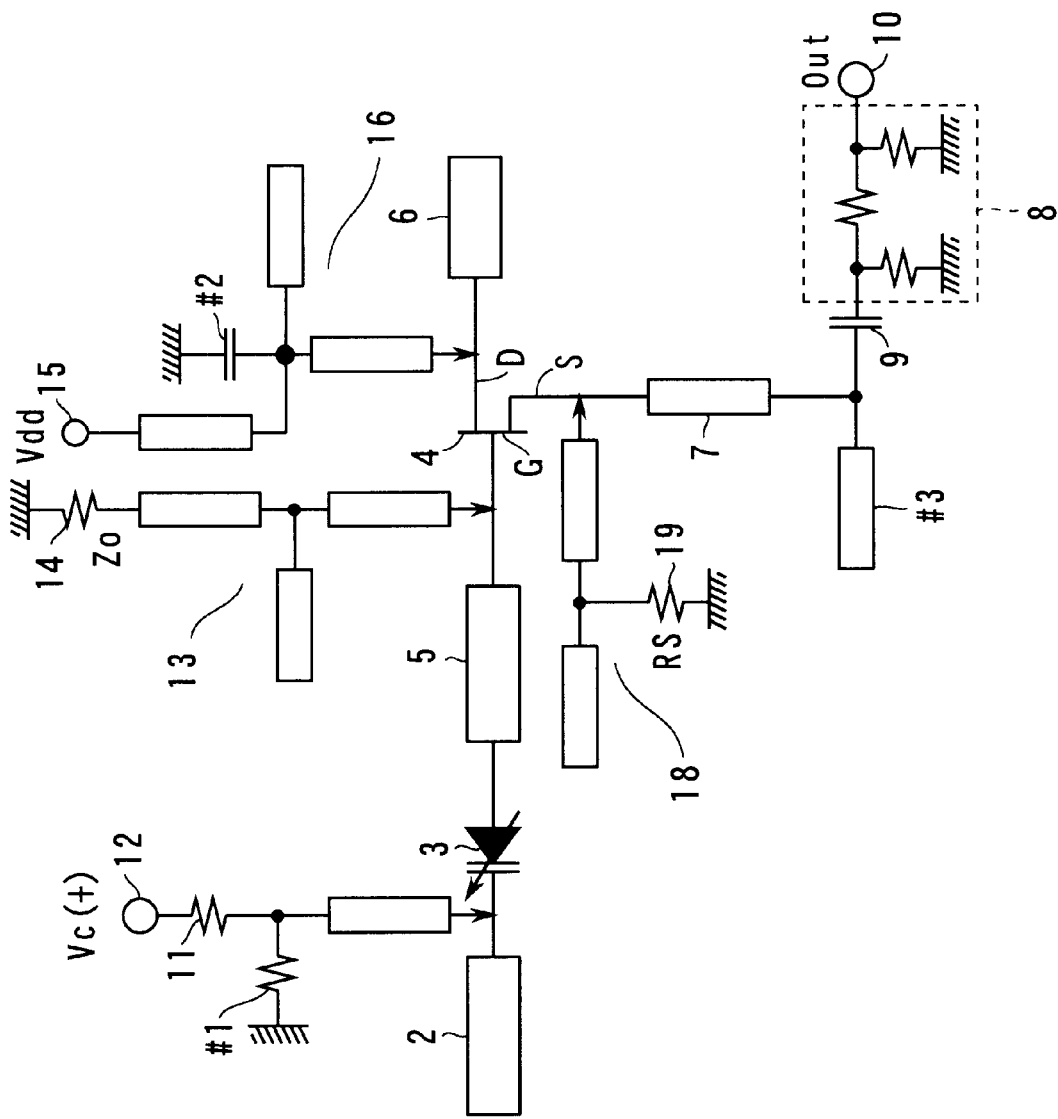
FIG. 16 is a circuit diagram of the voltage-controlled oscillator shown in FIG. 15.

FIG. 15 is a plan view more specifically showing an exemplary structure of the voltage-controlled oscillator shown in FIG. 1. FIG. 16 is a circuit diagram of the voltage-controlled oscillator shown in FIG. 15.

The voltage-controlled oscillator shown in FIGS. 15 and 16 is a voltage-controlled oscillator module obtained by mounting a packaged transistor, a semiconductor element such as a varactor diode and chip components such as a resistor and a capacitor on a dielectric substrate 1 of alumina ceramic having a circuit pattern formed by a thin-film conductor such as gold. Referring to FIG. 15, rectangles "C" denote chip capacitors, and rectangles "R" denote chip resistors.

A transistor 4 of GaAs is formed on the dielectric substrate 1. A grounding conductor is formed on the rear surface of the dielectric substrate 1. A gate-side feedback microstrip line 5, a drain-side feedback microstrip line 6 and an output microstrip line 7 are formed on the dielectric substrate 1. A gate electrode G, a drain electrode D and a source electrode S of the transistor 4 are connected to first ends of the gate-side feedback microstrip line 5, the drain-side feedback microstrip line 6 and the output microstrip line 7 respectively.

A sectorial tuning stub (radial stub) 2 is formed on the dielectric substrate 1. Low characteristic impedance can be readily implemented by employing the sectorial tuning stub 2. A second end of the microstrip line 5 is connected to an anode A of a varactor diode 3. A cathode C of the varactor diode 3 is connected to a first end of the tuning stub 2. In the example shown in FIG. 15, a second end of the tuning stub 2 is opened.

The cathode C of the varactor diode 3 is connected to a pad electrode 12 receiving a positive control voltage $V_C(+)$ through a control bias resistor 11 and connected to a pad electrode 21 receiving a ground potential GND through a resistor #1. The control bias resistor 11 and the resistor #1 form a control voltage application circuit. The control bias resistor 11 has a large resistance value of 10 kΩ, for example. Therefore, the control voltage $V_C(+)$ can be applied to the cathode C of the varactor diode 3 without leaking any signal.

The gate electrode G of the transistor 4 is connected to a pad electrode 20 receiving the ground potential GND through a band rejection filter 13 rejecting passage of a high frequency of the oscillation band and a terminal resistor 14.

A second end of the microstrip line 6 is opened. The drain electrode D of the transistor 4 is connected to a pad electrode 15 through a band rejection filter 16 rejecting passage of the high frequency of the oscillation band. The pad electrode 15 is grounded through a bypass capacitor #2. A drain bias Vdd is applied to the pad electrode 15.

The source electrode S of the transistor 4 is connected to a pad electrode 21 receiving the ground potential GND through a band rejection filter 18 rejecting passage of the high frequency of the oscillation band and a self-bias resistor 19.

A second end of the microstrip line 7 is connected to an output node 10 through an attenuator 8 and a dc component removing circuit 9. The dc component removing circuit 9 is formed by a capacitor. The second end of the microstrip line 7 is provided with a radial stub #3 having an opened forward end forming a feedback circuit.

In the voltage-controlled oscillator of this example, an impedance transformer 210 is formed with a radial tuning stub 2, provided with an opened forward end, having low characteristic impedance corresponding to 28Ω thereby attaining a broadband tuning range.

The control voltage $V_C(+)$ is divided by the resistors thereby reducing a voltage applied to the varactor diode 3.

Figure 17:
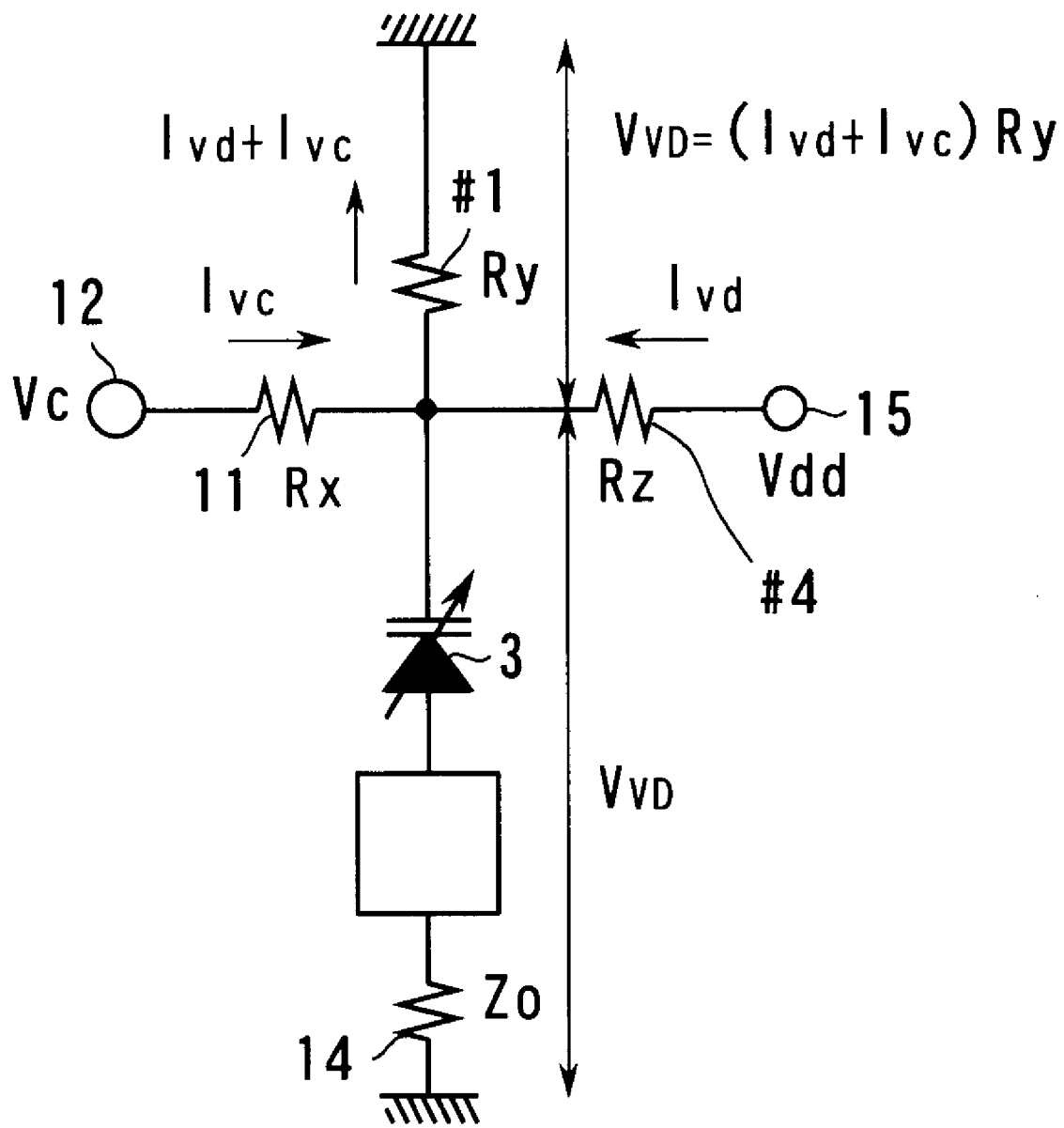
FIG. 17 is a circuit diagram showing the structure of a control voltage application circuit.

FIG. 17 is a circuit diagram showing the structure of the control voltage application circuit.

Referring to FIG. 17, it is assumed that $R_x$, $R_y$ and $R_z$ denote the resistance values of the resistors 11 and #1 and a resistor #4 respectively. When the resistance values $R_x$, $R_y$ and $R_z$ of the resistors 11, #1 and #4 are sufficiently large, currents $I_{vc}$ and $I_{vd}$ flowing through the resistors 11 and #4 respectively are expressed as follows:

$$I_{vc} = (V_{Cc} \pm \alpha)/(R_x + R_y)$$

where $V_C$, equal to $V_{Cc} \pm \alpha$, denotes a variable voltage.

$$I_{vd} = Vdd/(Rz + Ry)$$

A voltage $V_{VD}$ applied across the varactor diode 3 is expressed as follows:

$$V_{VD} = (I_{vd} + I_{vc})R_y \qquad (1)$$
$$= \{Vdd/(R_z + R_y) + (V_{Cc} \pm \alpha)/(R_x + R_y)\}R_y$$

It is understood from the above equation that the voltage $V_{VD}$ applied across the varactor diode 3 can be controlled by the control voltage $V_C(+)$ and the drain bias Vdd.

In this example, the resistance values $R_x$, $R_y$ and $R_z$ of the resistors 11, #1 and #4 are set as follows:

$R_x = 10 [K\Omega]$
$R_y = 5 [K\Omega]$
$R_z = \infty$

In this example, the resistor #4 is not connected, and the drain bias Vdd is not used.

In this case, ⅓ of the control voltage $V_C(+)$ is applied across the varactor diode 3. In other words, the voltage $V_{VD}$ is equal to $V_C(+)/3$.

Figure 18:
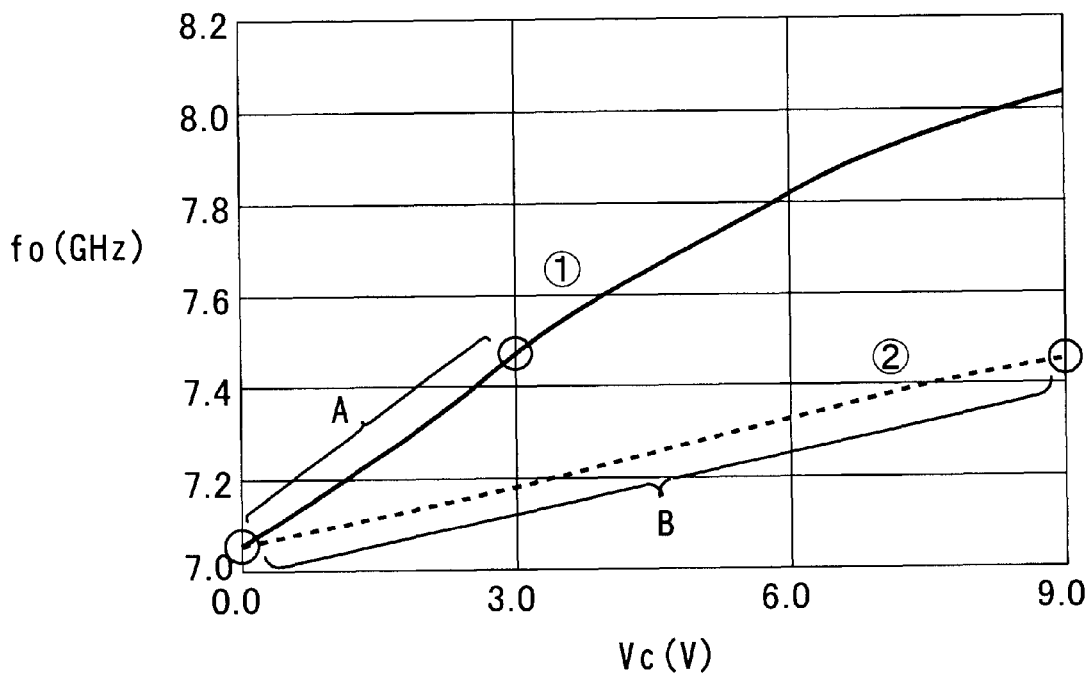
FIG. 18 illustrates control voltage dependency of an oscillation frequency.

FIG. 18 illustrates control voltage dependency of the oscillation frequency fo. Referring to FIG. 18, a line ① shows a characteristic obtained when attaining a broadband tuning range, and a line ② shows a characteristic obtained by extending control voltage change necessary for obtaining the same tuning range by improving the control voltage application circuit from a range A of 0 to 3 V to a range B of 0 to 9 V. Thus, precision of a voltage value required to the control voltage in tuning is relaxed as follows:

In the case of the characteristic ①, the tuning range is about 1 GHz at the oscillation frequency fo of 7.08 to 8.04 [GHz] when change of the control voltage $V_C$ is 0 to 9 V. When change of the control voltage $V_C$ is 0 to 3 V, the tuning range is about 0.4 GHz at the oscillation frequency fo of 7.08 to 7.48 [GHz]. In the case of the characteristic ②, on the other hand, the tuning range is about 0.4 GHz at the oscillation frequency fo of 7.08 to 7.48 [GHz] when change of the control voltage $V_C$ is 0 to 9 V.

Thus, precision of the voltage value required to the control voltage in tuning is so relaxed that the oscillation frequency can be correctly controlled.

Figure 19:
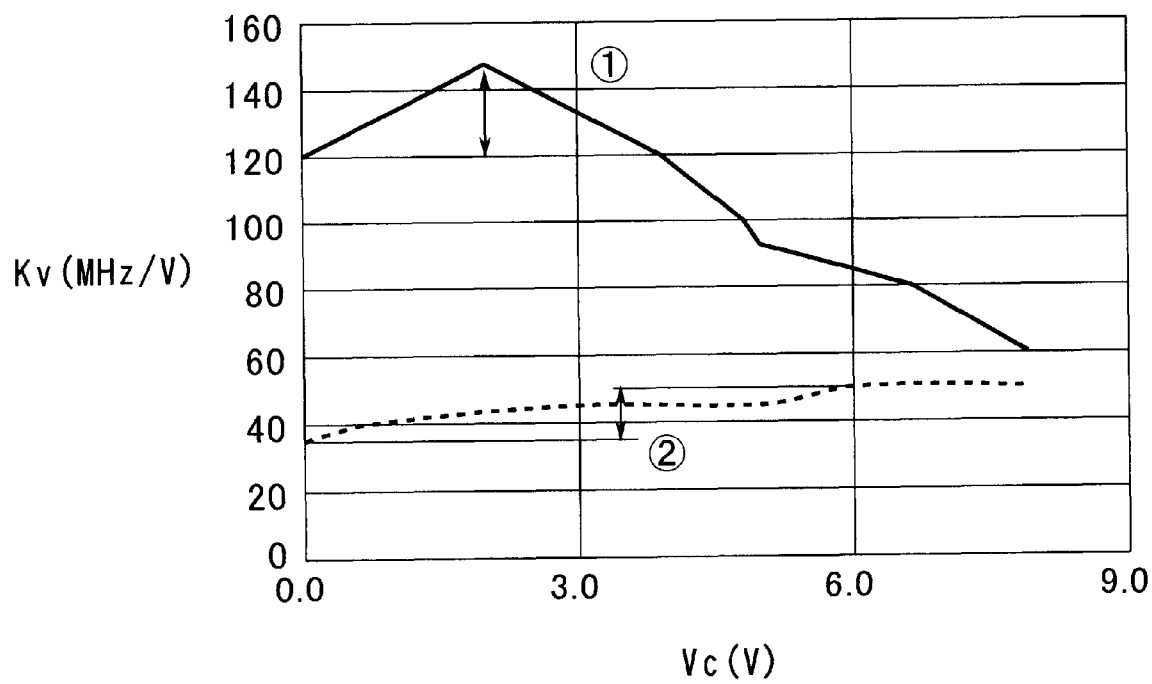
FIG. 19 illustrates control voltage dependency of tuning sensitivity.

FIG. 19 illustrates control voltage dependency of tuning sensitivity Kv. The tuning sensitivity Kv indicates the rate of change of the oscillation frequency with respect to change of the control voltage $V_C$.

As shown in FIG. 19, linearity of the tuning sensitivity Kv (fluctuation of the tuning sensitivity with respect to the control voltage) can be apparently improved by improving the characteristic ① to the characteristic ②.

As hereinabove described, the tuning range can be optimized bys electing a desired range in the broadband tuning range.

The voltage-controlled oscillator, provided in the form of a module in this example, may alternatively be formed by a monolithic oscillator integrated on a semiconductor substrate.

Figure 20:
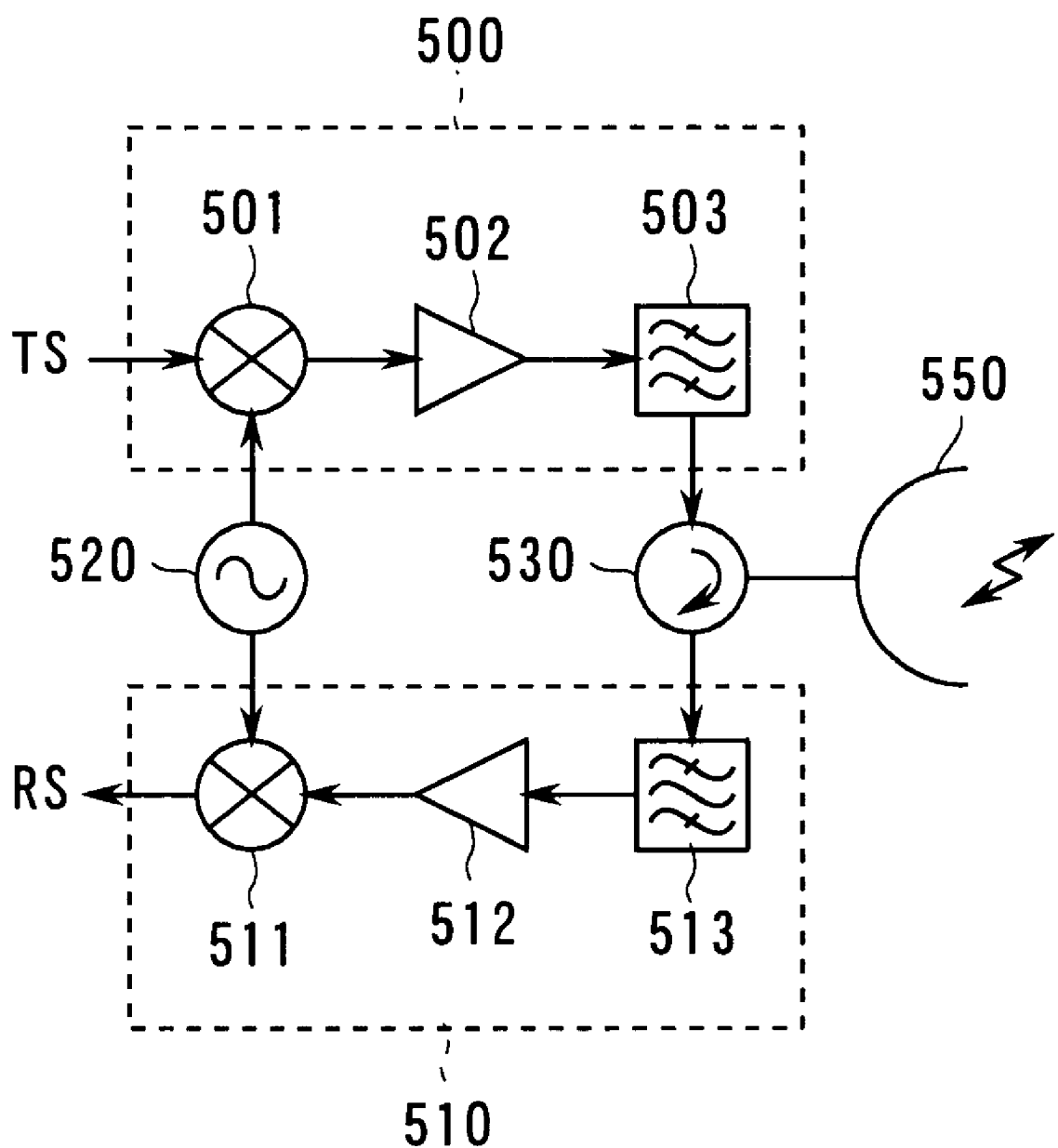
FIG. 20 is a model diagram showing the structure of a transmitter/receiver for a radio communication system employing the voltage-controlled oscillator shown in FIG. 1.

FIG. 20 is a model diagram showing the structure of a transmitter/receiver for a radio communication system employing the voltage-controlled oscillator shown in FIG. 1.

The transmitter/receiver shown in FIG. 20 is formed by a transmission system 500, a receiving system 510, a local oscillator 520, a signal path switch 530 and an antenna 550.

The transmission system 500 includes a frequency converter 501, an amplifier 502 and a band-pass filter 503. The receiving system 510 includes a frequency converter 511, an amplifier 512 and a band-pass filter 513. The local oscillator 520, formed by the voltage-controlled oscillator shown in FIG. 1, generates a reference signal of a prescribed oscillation frequency.

The frequency converter 501 of the transmission system 500 mixes a transmitted signal TS of a prescribed frequency with the reference signal generated from the local oscillator 520, thereby converting the same to a transmitted signal of a high frequency. The amplifier 502 amplifies the transmitted signal obtained by the frequency converter 501. The band-pass filter 503 passes a signal component of a prescribed band in the transmitted signal amplified by the amplifier 502, and supplies the same to the antenna 550 through the signal path switch 530. Thus, the antenna 550 transmits a radio wave of a microwave or a quasi-millimeter wave.

The radio wave of a microwave or a quasi-millimeter wave received by the antenna 550 is supplied to the band-pass filter 513 of the receiving system 510 through the signal path switch 530. The band-pass filter 513 passes a received signal of a prescribed band included in the radio wave. The amplifier 512 amplifies the received signal passed through the band-pass filter 513. The frequency converter 501 mixes the received signal amplified by the amplifier 512 with the reference signal generated from the local oscillator 520, thereby converting the same to a received signal RS of a low frequency.

The transmitter/receiver shown in FIG. 20 employs the voltage-controlled oscillator shown in FIG. 1 as the local oscillator 520, whereby a broadband tuning range can be attained.

The oscillation frequency of the local oscillator 520 linearly changes with respect to the control voltage, while fluctuation of the phase noise characteristic resulting from change of the oscillation frequency is reduced. Further, the phase noise characteristic of the local oscillator 520 is improved.

Consequently, fluctuation of the communication quality resulting from switching of the frequency band or the channel allocated to the communication system as well as deterioration of the communication quality resulting from phase noise are reduced.

(Method of Deriving Equation)

Methods of deriving the above equations (A2) and (B2) are now described with reference to FIGS. 6 and 7.

It is assumed that the resistance component of the variable reactance circuit 220 is zero, and only the capacity of the varactor diode 3 is taken into consideration as the capacitive component.

It is further assumed that $Z_{stub}$ denotes the impedance of the tuning stub 2 as viewed from the node Q between the variable reactance circuit 220 and the impedance transformer 210.

As described above, $\omega_x$ denotes the oscillation angular frequency at the arbitrary control voltage $V_x$, $\omega_C$ denotes the oscillation angular frequency (center oscillation angular frequency) at the central control voltage $V_C$, and $\omega_n$ denotes the oscillation angular frequency normalized with the oscillation angular frequency $\omega_C$, where $\omega_n = \omega_x/\omega_C$.

$C_x$ denotes the capacity of the varactor diode 3 at the arbitrary control voltage $V_x$, $C_C$ denotes the capacity (central capacity) of the varactor diode 3 at the central control voltage $V_C$, and $C_n$ denotes the capacity of the varactor diode 3 normalized with the capacity $C_C$, where $C_n = C_x/C_C$. At the central control voltage $V_C$, $\omega_n = 1$ and $C_n = 1$.

$Z_{st}$ denotes the characteristic impedance [Ω] of the tuning stub 2, and $\theta_{st}$ denotes the electric length [rad] of the tuning stub 2 at the center oscillation angular frequency $\omega_C$.

(When Employing Open Stub)

The impedance $Z_{stub}$ of the tuning stub 2 as viewed from the node Q between the variable reactance circuit 220 and the impedance transformer 210 is expressed as follows:

$$Z_{stub} = -jZ_{st}\cot(\omega_n \cdot \theta_{st}) \tag{a1}$$

The impedance $Z_{mod}$ of the tuning part 200 as viewed from the node P between the oscillation part 100 and the tuning part 200 is expressed as follows:

$$Z_{mod} = j\{-Z_{st}\cot(\omega_n \cdot \theta_{st}) + X_{VD}\} = jX_{mod} \tag{a2}$$

where $X_{VD}$ denotes the reactance of the variable reactance circuit 220. From the above equation (a2), the reactance $X_{mod}$ of the tuning part 200 as viewed from the node P between the oscillation part 100 and the tuning part 200 is expressed as follows:

$$X_{mod} = -Z_{st}\cot(\omega_n \cdot \theta_{st}) + X_{VD} \tag{a3}$$

Assuming that $L_p$ denotes the inductance of the variable reactance circuit 220, the inductive component of the variable reactance circuit 220 is expressed as follows:

$$\omega_n \cdot L_p = \omega_x \cdot \omega_C \cdot L_p = \omega_n \cdot A \tag{a4}$$

where $A = \omega_C \cdot L_p$ = constant

The capacitive component of the variable reactance circuit 220 is expressed as follows:

$$1/(\omega_x \cdot C_x) = 1/(\omega_n \cdot \omega_c \cdot C_n \cdot C_C) \tag{a5}$$

$$= B/(\omega_n \cdot C_n)$$

where $B = 1/(\omega_C/C_C)$ = constant

From the above equations (a4) and (a5), the reactance $X_{VD}$ of the variable reactance circuit 220 is expressed as follows:

$$X_{VD} = \omega_x \cdot L_p - 1/(\omega_x \cdot C_x) \tag{a6}$$

$$= \omega_n \cdot A - B/(\omega_n \cdot C_n)$$

$$= X_{VD}(\omega_n, C_n)$$

Thus, the reactance $X_{VD}$ of the variable reactance circuit 220 is expressed in the functions of the oscillation angular frequency $\omega_n$ and the capacity $C_n$.

Setting $A/B=\omega^2{}_C \cdot L_p \cdot C_C=\alpha$, the variable reactance circuit 220 is inductive when $\alpha>1$, capacitive when $\alpha<1$, and series-resonant when $\alpha=1$.

From the above equation (a6), the reactance $X_{VD}(\omega_n, C_n)$ of the variable reactance circuit 220 is expressed as follows:

$$X_{VD}(\omega_n, C_n)=B\{\omega_n \cdot \alpha - 1/(\omega_n \cdot C_n)\} \quad \text{(a7)}$$

From the above equations (a3) and (a7), therefore, the reactance $X_{mod}(\omega_n, C_n)$ is expressed as follows:

$$\begin{aligned} X_{mod}(\omega_n, C_n) &= -Z_{st}\cot(\omega_n \cdot \theta_{st}) + X_{VD}(\omega_n, C_n) \\ &= -Z_{st}\cot(\omega_n \cdot \theta_{st}) + B\{\omega_n \cdot \alpha - 1/(\omega_n \cdot C_n)\} \end{aligned} \quad \text{(a8)}$$

The voltage-controlled oscillator is so designed that the reactance $X_{mod}$ is shorted at the center oscillation angular frequency ($\omega_n=1$) and the central capacity ($C_n=1$). Thus, the reactance $X_{mod}(1, 1)$ is expressed as follows when $\omega_n=1$ and $C_n=1$ from the above equation (a8):

$$X_{mod}(1, 1)=-Z_{st}\cot\theta_{st}+B(\alpha-1)=0 \quad \text{(a9)}$$

The following equation holds from the above equation (a9):

$$Z_{st}=B(\alpha-1)/\cot\theta_{st}=B(\alpha-1)\tan\theta_{st} \quad \text{(a10)}$$

From the above equations (a8) and (a10), therefore, the reactance $X_{mod}$ is expressed as follows:

$$X_{mod}(\omega_n, C_n)=B\{(1-\alpha)\tan\theta_{st}\cot(\omega_n \cdot \theta_{st})+\omega_n \cdot \alpha - 1/(\omega_n \cdot C_n)\} \quad \text{(a11)}$$

The oscillation angular frequency ($\omega_x=\omega_n \cdot \omega_C$) is given by an oscillation angular frequency $\omega_n$ satisfying $X_{mod}(\omega_n, C_n)=0$ when the capacity $C_n$ of the varactor diode 3 changes.

Considering a capacity $C_n$ satisfying $X_{mod}(\omega_n, C_n)=0$ when the oscillation angular frequency $\omega_n$ changes, the following equation holds from the above equation (a11):

$$(1-\alpha)\tan\theta_{st}\cot(\omega_n \cdot \theta_{st})+\omega_n \cdot \alpha - 1/(\omega_n \cdot C_n)=0 \quad \text{(a12)}$$

The above equation (a12) is rearranged with the capacity $C_n$ as follows:

$$1/(\omega_n \cdot C_n)=\omega_n \cdot \alpha + (1-\alpha)\tan\theta_{st}\cot(\omega_n \cdot \theta_{st}) \quad \text{(a13)}$$

Further, the following equation is obtained from the above equation (a13):

$$C_n(\omega_n)=1/[\omega_n\{\omega_n \cdot \alpha + (1-\alpha)\tan\theta_{st}\cot(\omega_n \cdot \theta_{st})\}] \quad \text{(a14)}$$

Differentiating the capacity $C_n(\omega_n)$ of the above equation (a14) by the oscillation angular frequency $\omega_n$, the rate $C_n'(1)$ of change of the capacity at the center oscillation angular frequency ($\omega_n=1$) is obtained as follows:

$$C_n'(1)=(1-\alpha) \cdot 2\theta_{st}/\sin(2\theta_{st})-(1+\alpha) \quad \text{(A2)}$$

(When Employing Short Stub)

The impedance $Z_{stub}$ of the tuning stub 2 as viewed from the node Q between the variable reactance circuit 220 and the impedance transformer 210 is expressed as follows:

$$Z_{stub}=jZ_{st}\tan(\omega_n \cdot \theta_{st}) \quad \text{(b1)}$$

The impedance $Z_{mod}$ of the tuning part 200 as viewed from the node P between the oscillation part 100 and the tuning part 200 is expressed as follows:

$$Z_{mod}=j\{Z_{st}\tan(\omega_n \cdot \theta_{st})+X_{VD}\}=jX_{mod} \quad \text{(b2)}$$

where $X_{VD}$ denotes the reactance of the variable reactance circuit 220. From the above equation (b2), the reactance $X_{mod}$ of the tuning part 200 as viewed from the node P between the oscillation part 100 and the tuning part 200 is expressed as follows:

$$X_{mod}=Z_{st}\tan(\omega_n \cdot \theta_{st})+X_{VD} \quad \text{(b3)}$$

Assuming that $L_p$ denotes the inductance of the variable reactance circuit 220, the inductive component of the variable reactance circuit 220 is expressed as follows:

$$\omega_n \cdot L_p = \omega_x \cdot \omega_C \cdot L_p = \omega_n \cdot A \quad \text{(b4)}$$

where $A=\omega_C \cdot L_p=$ constant

The capacitive component of the variable reactance circuit 220 is expressed as follows:

$$\begin{aligned} 1/(\omega_x \cdot C_x) &= 1/(\omega_n \cdot \omega_C \cdot C_n \cdot C_C) \\ &= B/(\omega_n \cdot C_n) \end{aligned} \quad \text{(b5)}$$

where $B=1/(\omega_C \cdot C_C)=$ constant.

From the above equations (b4) and (b5), the reactance $X_{VD}$ of the variable reactance circuit 220 is expressed as follows:

$$\begin{aligned} X_{VD} &= \omega_x \cdot L_p - 1/(\omega_x \cdot C_x) \\ &= \omega_n \cdot A - B/(\omega_n \cdot C_n) \\ &= X_{VD}(\omega_n, C_n) \end{aligned} \quad \text{(b6)}$$

Thus, the reactance $X_{VD}$ of the variable reactance circuit 220 is expressed in the functions of the oscillation angular frequency $\omega_n$ and the capacity $C_n$.

Setting $A/B=\omega^2{}_C \cdot L_p \cdot C_C=\alpha$, the variable reactance circuit 220 is inductive when $\alpha>1$, capacitive when $\alpha<1$, and series-resonant when $\alpha=1$.

From the above equation (b6), the reactance $X_{VD}(\omega_n, C_n)$ of the variable reactance circuit 220 is expressed as follows:

$$X_{VD}(\omega_n, C_n)=B\{\omega_n \cdot \alpha - 1/(\omega_n \cdot C_n)\} \quad \text{(b7)}$$

From the above equations (b3) and (b7), therefore, the reactance $X_{mod}(\omega_n, C_n)$ is expressed as follows:

$$\begin{aligned} X_{mod}(\omega_n, C_n) &= Z_{st}\tan(\omega_n \cdot \theta_{st}) + X_{VD}(\omega_n, C_n) \\ &= Z_{st}\tan(\omega_n \cdot \theta_{st}) + B\{\omega_n \cdot \alpha - 1/(\omega_n \cdot C_n)\} \end{aligned} \quad \text{(b8)}$$

The voltage-controlled oscillator is so designed that the reactance $X_{mod}$ is shorted at the center oscillation angular frequency ($\omega_n=1$) and the central capacity ($C_n=1$). Thus, the reactance $X_{mod}(1, 1)$ is expressed as follows when $\omega_n=1$ and $C_n=1$ from the above equation (b8):

$$X_{mod}(1,1)=Z_{st}\tan\theta_{st}+B(\alpha-1)=0 \quad \text{(b9)}$$

The following equation holds from the above equation (b9):

$$Z_{st}=B(1-\alpha)/\tan\theta_{st}=B(1-\alpha)\cot\theta_{st} \quad \text{(b10)}$$

From the above equations (b8) and (b10), therefore, the reactance $X_{mod}$ is expressed as follows:

$$X_{mod}(\omega_n, C_n)=B\{(1-\alpha)\cot\theta_{st}\tan(\omega_n \cdot \theta_{st})+\omega_n \cdot \alpha - 1/(\omega_n \cdot C_n)\} \quad \text{(b11)}$$

The oscillation angular frequency ($\omega_x=\omega_n \cdot \omega_C$) is given by an oscillation angular frequency $\omega_n$ satisfying $X_{mod}(\omega_n, C_n)=0$ when the capacity $C_n$ of the varactor diode 3 changes.

Considering a capacity $C_n$ satisfying $X_{mod}(\omega_n, C_n)=0$ when the oscillation angular frequency $\omega_n$ changes, the following equation holds from the above equation (b11):

$$(1-\alpha)\cot\theta_{st}\tan(\omega_n\cdot\theta_{st})+\omega_n\cdot\alpha-1/(\omega_n\cdot C_n)=0 \quad (b12)$$

The above equation (b12) is rearranged with the capacity $C_n$ as follows:

$$1/(\omega_n\cdot C_n)=\omega_n\cdot\alpha+(1-\alpha)\cot\theta_{st}\tan(\omega_n\cdot\theta_{st}) \quad (b13)$$

Further, the following equation is obtained from the above equation (b13):

$$C_n(\omega_n)=1/[\omega_n\{\omega_n\cdot\alpha+(1-\alpha)\cot\theta_{st}\tan(\omega_n\cdot\theta_{st})\}] \quad (b14)$$

Differentiating the capacity $C_n(\omega_n)$ of the above equation (b14) by the oscillation angular frequency $\omega_n$, the rate $C_n'(1)$ of change of the capacity at the center oscillation angular frequency ($\omega_C=1$) is obtained as follows:

$$C_n'(1)=(\alpha-1)\cdot 2\theta_{st}/\sin(2\theta_{st})-(1+\alpha) \quad (B2)$$

Thus, the characteristic impedance $Z_{st}$ of the tuning stub 2 and the rate $C_n'(1)$ of change of the capacity of the varactor diode 3 at the center oscillation angular frequency ($\omega_C=1$) are obtained as follows, where $\alpha=\omega^2{}_C\cdot L_p\cdot C_C$ and series resonance is attained when $\alpha$ is equal to 1:

(when employing an open stub)

$$Z_{st}=B(\alpha-1)\tan\theta_{st} \quad (A1)$$

$$C_n'(1)=(1-\alpha)\cdot 2\theta_{st}/\sin(2\theta_{st})-(1+\alpha) \quad (A2)$$

(when employing a short stub)

$$Z_{st}=B(1-\alpha)\cot\theta_{st} \quad (B1)$$

$$C_n'(1)=(\alpha-1)\cdot 2\theta_{st}/\sin(2\theta_{st})-(1+\alpha) \quad (B2)$$

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A voltage-controlled oscillator comprising:
an oscillation part performing oscillation; and
a tuning part resonating within the oscillation frequency band of said oscillation part, wherein
said tuning part includes:
an impedance transformer including a transmission line, and
a variable reactance circuit, connected between an end of said transmission line and said oscillation part, including a variable capacitance element having a capacitance value varying with a control voltage and an inductive component,
a locus drawn by the impedance of said tuning part as viewed from the node between said oscillation part and said tuning part in response to change of said control voltage includes a point where reactance reaches substantially zero, and
the characteristic impedance of said transmission line is so set that the rate of change of the capacitance value of said variable capacitance element with respect to change of the oscillation frequency is minimized within a prescribed range of the characteristic impedance of said transmission line.

2. The voltage-controlled oscillator according to claim 1, wherein
the impedance of said tuning part as viewed from the node between said oscillation part and said tuning part at the central value of said control voltage is so set that the reactance reaches substantially zero.

3. The voltage-controlled oscillator according to claim 1, wherein
the other end of said transmission line is opened, the reactance of said variable reactance circuit is inductive at the central value of said control voltage, and the characteristic impedance of said transmission line is set to the minimum value within said prescribed range.

4. The voltage-controlled oscillator according to claim 3, wherein
the characteristic impedance of said transmission line is set lower than 50Ω.

5. The voltage-controlled oscillator according to claim 1, wherein
the other end of said transmission line is opened, the reactance of said variable reactance circuit is capacitive at the central value of said control voltage, and the characteristic impedance of said transmission line is so set as to minimize the rate of change of the capacitance value of said variable capacitance element with respect to change of the oscillation frequency.

6. The voltage-controlled oscillator according to claim 5, wherein
the characteristic impedance of said transmission line is set substantially to $\tan(23\pi/32)$ times the reactance of said variable reactance circuit at the central value of said control voltage while the electric length of said transmission line is set substantially to $(23\pi/32)$ [rad].

7. The voltage-controlled oscillator according to claim 1, wherein
the other end of said transmission line is shorted, the reactance of said variable reactance circuit is inductive at the central value of said control voltage, and the characteristic impedance of said transmission line is so set as to minimize the rate of change of the capacitance value of said variable capacitance element with respect to change of the oscillation frequency.

8. The voltage-controlled oscillator according to claim 7, wherein
the characteristic impedance of said transmission line is set substantially to $\cot(23\pi/32)$ times the reactance of said variable reactance circuit at the central value of said control voltage, and the electric length of said transmission line is set substantially to $(23\pi/32)$ [rad].

9. The voltage-controlled oscillator according to claim 1, wherein
the other end of said transmission line is shorted, the reactance of said variable reactance circuit is capacitive at the central value of said control voltage, and the characteristic impedance of said transmission line is set to the maximum value within said prescribed range.

10. The voltage-controlled oscillator according to claim 9, wherein
the characteristic impedance of said transmission line is set higher than 50Ω.

11. The voltage-controlled oscillator according to claim 1, wherein the other end of said transmission line is opened, said inductive component and a capacitive component of said variable reactance circuit are equally set at the central value of said control voltage, and the electric length of said transmission line is set substantially to $(\pi/2)$ [rad].

12. The voltage-controlled oscillator according to claim 1, wherein the other end of said transmission line is shorted, said inductive component and a capacitive component of said variable reactance circuit are equally set at the central value of said control voltage, and the electric length of said transmission line is set substantially to 0 [rad].

13. The voltage-controlled oscillator according to claim 1, wherein a fixed capacitor is added to said variable capacitance element in a serial or parallel manner.

14. A communication device comprising:

a local oscillator including a voltage-controlled oscillator generating a reference signal; and a frequency converter mixing said reference signal generated by said local oscillator with a transmitted signal or a received signal thereby converting the frequency of said transmitted signal or said received signal to a prescribed frequency, wherein said voltage-controlled oscillator comprises:

an oscillation part performing oscillation, and a tuning part resonating within the oscillation frequency band of said oscillation part, said tuning part includes:

an impedance transformer including a transmission line, and a variable reactance circuit, connected between an end of said transmission line and said oscillation part, including a variable capacitance element having a capacitance value varying with a control voltage and an inductive component, a locus drawn by the impedance of said tuning part as viewed from the node between said oscillation part and said tuning part in response to change of said control voltage includes a point where reactance reaches zero, and the characteristic impedance of said transmission line is so set that the rate of change of the capacitance value of said variable capacitance element with respect to change of the oscillation frequency is minimized within a prescribed range of the characteristic impedance of said transmission line.

* * * * *